US006320420B1

(12) United States Patent
Shibayama

(10) Patent No.: US 6,320,420 B1
(45) Date of Patent: Nov. 20, 2001

(54) DOMINO LOGIC ELEMENT REALIZING HIGH SPEED DYNAMIC LOGIC CIRCUIT

(75) Inventor: Atsufumi Shibayama, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/534,830

(22) Filed: Mar. 23, 2000

(30) Foreign Application Priority Data

Mar. 26, 1999 (JP) .......................... 11-084904

(51) Int. Cl.[7] .......................... H03K 19/096
(52) U.S. Cl. .......................... 326/95; 326/98; 326/93
(58) Field of Search .......................... 326/93, 95, 98, 326/112, 119, 121

(56) References Cited

U.S. PATENT DOCUMENTS 5,825,208 * 10/1998 Levy et al. .......................... 326/98
5,831,452 * 11/1998 Nowak et al. .......................... 326/98
6,011,410 * 1/2000 Kime et al. .......................... 326/98
6,018,254 * 1/2000 Rogers et al. .......................... 326/96

FOREIGN PATENT DOCUMENTS 63-93222 4/1988 (JP) .
7-288465 10/1995 (JP) .
8-509084 9/1996 (JP) .
2697635 9/1997 (JP) .
10-73644 3/1998 (JP) .

OTHER PUBLICATIONS

"Principles of CMOS VLSI Design", Neil H.E. Weste et al. Addision–Weslay Publishing pp. 301–303, 308–311.

* cited by examiner

*Primary Examiner*—Michael Tokar
*Assistant Examiner*—Anh Q. Tran
(74) *Attorney, Agent, or Firm*—Hayes, Soloway, Hennessey, Grossman & Hage PC

(57) ABSTRACT

A dynamic logic element and a dynamic logic circuit realized by using such dynamic logic elements which is not affected by a clock skew and is capable of operating at high speed. The dynamic logic element comprises a detecting circuit portion which receives an output signal of the dynamic logic element fed back thereto, which detects completion of a precharge operation, and which, upon detection of completion of a precharge operation, autonomously finishes a precharge phase and starts an evaluation phase. A plurality of the dynamic logic elements are coupled in tandem to form a domino logic circuit. A plurality of the domino logic circuits are coupled in tandem without interposing a buffer circuit therebetween to realize a high speed dynamic logic circuit.

20 Claims, 11 Drawing Sheets

VDD VDD 10 18 11 14 15 16 19 13a 40 13 12 30 φp 17 GND GND

CLOCK SKEW Ts
1 CYCLE TIME T

CLOCK SIGNAL φ

CLOCK SIGNAL φp1

CLOCK SIGNAL φp2

DOMINO LOGIC 110
Ts
PRECHARGE
EVALUATION
PRECHARGE
EVALUATION

DOMINO LOGIC 120
EVALUATION
PRECHARGE
EVALUATION

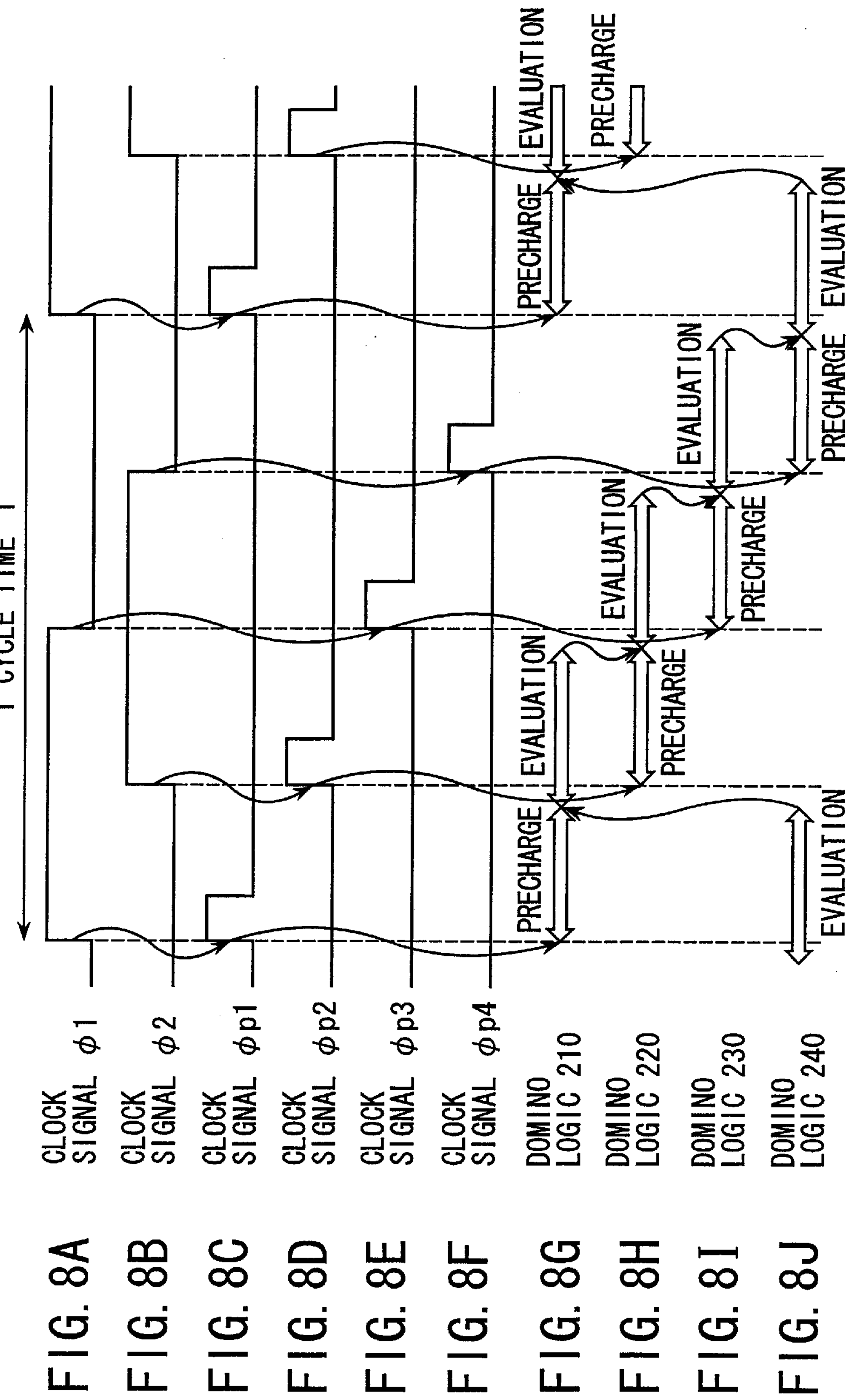
1 CYCLE TIME T
FIG. 8A CLOCK SIGNAL φ1
FIG. 8B CLOCK SIGNAL φ2
FIG. 8C CLOCK SIGNAL φp1
FIG. 8D CLOCK SIGNAL φp2
FIG. 8E CLOCK SIGNAL φp3
FIG. 8F CLOCK SIGNAL φp4
FIG. 8G DOMINO LOGIC 210
FIG. 8H DOMINO LOGIC 220
FIG. 8I DOMINO LOGIC 230
FIG. 8J DOMINO LOGIC 240
PRECHARGE
EVALUATION
PRECHARGE
EVALUATION
PRECHARGE
EVALUATION
PRECHARGE
EVALUATION
PRECHARGE
EVALUATION
PRECHARGE
EVALUATION
PRECHARGE
EVALUATION
EVALUATION
EVALUATION

PRIOR ART

DOMINO LOGIC ELEMENT REALIZING HIGH SPEED DYNAMIC LOGIC CIRCUIT

FIELD OF THE INVENTION

The present invention relates generally to a domino logic element and a dynamic logic circuit, and more particularly to a domino logic element and a dynamic logic circuit using such domino logic elements which is not affected by a clock skew and is capable of operating at high speed.

BACKGROUND OF THE INVENTION

A dynamic logic circuit is known as one of means for realizing semiconductor logic circuits. Dynamic logic circuit has the merits of high operating speed, small power consumption, small layout area in an integrated circuit, and the like. Especially, a domino logic circuit as a kind of the dynamic logic circuit is widely used to realize an integrated circuit which should have a high operating speed.

FIG. 10 is a circuit diagram showing a structure of a conventional domino logic element 400 used for constituting a domino logic circuit. As shown in FIG. 10, the conventional domino logic element 400 comprises a p-type MOS transistor 401 for precharging, an n-type MOS transistor 402 for discharging, an n-type MOS transistor logic network (hereafter referred to as an nMOS logic network) 403, and an output inverter 404.

The source terminal of the p-type MOS transistor 401 is coupled to a power supply terminal VDD, the gate terminal thereof is coupled to a clock input terminal 410, and the drain terminal thereof is coupled to a dynamic node 406. The p-type MOS transistor 401 functions to precharge the dynamic node 406, based on a clock signal φ inputted from the clock input terminal 410.

The nMOS logic network 403 comprises a plurality of n-type MOS transistors 403*a* whose gate terminals are coupled to signal input terminals 420. The n MOS logic network 403 are disposed between the dynamic node 406 and the n-type MOS transistor for discharging 402, namely, are coupled between the dynamic node 406 and the drain terminal of the n-type MOS transistor for discharge 402. Depending on the connection of the n-type MOS transistor 403*a* in the nMOS logic network 403, the domino logic element 400 performs a desired logical function.

The drain terminal of the n-type MOS transistor 402 for discharging is coupled to the nMOS logic network 403, the gate terminal thereof is coupled to the clock input terminal 410, and the source terminal thereof is coupled to the ground terminal GND. The n-type MOS transistor 402, together with the nMOS logic network 403, function to discharge electric charges stored in the dynamic node 406, based on the clock signal φ inputted from the clock input terminal 410.

The output inverter 404 inverts a logical potential of the dynamic node 406, and outputs an inverted logical potential to an output terminal 405.

Conventionally, the operation of the domino logic element 400 takes place in two distinct phases (or periods), i.e, a precharge phase (or period) and an evaluation phase (or period). These phases are alternately repeated.

In a precharge phase, a potential of the clock signal φ supplied from the clock input terminal 410 is a LOW potential level (hereafter referred to as L level) which is equal to the ground potential level at the ground terminal GND. In this case, the p-type MOS transistor 401 is turned on, that is, the source terminal and the drain terminal thereof are electrically coupled to each other. On the other hand, the n-type MOS transistor 402 is turned off, that is, the source terminal and the drain terminal thereof are isolated from each other. Therefore, a precharge operation is performed in which electric charges are stored into the dynamic node 406 until the potential of the dynamic node 406 becomes a HIGH potential level (hereafter referred to as H level) that is equal to the potential of the power supply terminal VDD.

In an evaluation phase, a potential of the clock signal φ supplied from the clock input terminal 410 is H level. In this case, the p-type MOS transistor 401 is turned off, and the n-type MOS transistor 402 is turned on. The nMOS logic network 403 couples or isolates between the dynamic node 406 and the drain terminal of the n-type MOS transistor 402, depending on logical values of input signals at the signal input terminals 420. Therefore, at the evaluation phase, electric charges of the dynamic node 406 which are precharged during the precharge phase are selectively discharged or retained depending on the logical values of the input signals at the signal input terminal 420. Thereby, an output signal is obtained from the output terminal 405, which output signal has a logical value obtained by performing a logical operation by the nMOS logic network 403 on the input signals at the input terminals 420.

Usually, since a circuit scale of the nMOS logic network 403 is limited by a circuit area and the like, a domino logic circuit is formed by connecting a plurality of domino logic elements 400 in tandem, to realize a desired logic circuit. Here, in order to make it possible to dispose as many logic elements as possible in one cycle of a clock signal, in most instances, a plurality of domino logic circuits are used having different timings of precharge and evaluation phases.

FIG. 11 is a circuit diagram showing an example of a logic circuit realized by using domino logic circuits controlled by two phase clock signals φ 1 and φ 2. The logic circuit shown in FIG. 11 comprises domino logic circuits 510 and 520 each of which is constituted of a plurality of tandem connected domino logic elements 400, and latch circuits 530, 540 and 550. In the logic circuit shown in FIG. 11, domino logic circuit 510, the latch circuit 540, the domino logic circuit 520 and the latch circuit 550 operate in one cycle of a clock signal.

The two phase clock signals φ 1 and φ 2 have a relationship complementary to each other. When the clock signal φ 1 has H level, the clock signal φ 2 has L level, and when the clock signal φ 1 has L level, the clock signal φ 2 has H level. These two phase clock signals φ 1 and φ 2 can be produced from a single phase clock signal by using it as it is and by inverting it. The clock signal φ 1 is applied to clock input terminals of the domino logic circuit 510 and the latch circuit 540, and the clock signal φ 2 is applied to clock input terminals of the domino logic circuit 520 and the latch circuits 530 and 550.

The domino logic circuit 510 is precharged when the clock signal φ 1 is in L level. The domino logic circuit 510 starts evaluation by using logical values of signals inputted from the latch circuit 530 when the clock signal φ1 becomes H level, and supplies an output signal to the latch circuit 540. When the clock signal φ1 is in H level, the clock signal φ2 is in L level, so that the domino logic circuit 520 is precharged. The latch circuit 540 passes the output signal of the domino logic circuit 510 to the domino logic circuit 520 as it is during a period the clock signal φ1 is in H level. Also, the latch circuit 540 stores the output signal of the domino logic circuit 510 at a timing the clock signal φ1 changes from H level to L level.

After the clock signal $\phi 1$ again becomes L level and during a period the domino logic circuit 510 is precharged, the latch circuit 530 outputs the stored output of the domino logic circuit 510 to the domino logic circuit 520. When the clock signal $\phi 1$ is in L level, the clock signal $\phi 2$ is in H level, so that the domino logic circuit 520 starts evaluation by using logical values of signals inputted from the latch circuit 540 and supplies an output signal to the latch circuit 550. The latch circuit 550 stores the output signal of the domino logic circuit 520 at a timing the clock signal $\phi 2$ changes from H level to L level.

As mentioned above, during a period the domino logic circuit 510 is performing evaluation, the domino logic circuit 520 performs precharge, and during a period the domino logic circuit 520 is performing evaluation, the domino logic circuit 510 performs precharge for evaluation of the next clock cycle. During a period the pre-stage domino logic circuit is in a precharge phase and the rear-stage domino logic circuit is in an evaluation phase, each of the latch circuits 530, 540 and 550 does not pass an output of the pre-stage domino logic circuit to the rear-stage domino logic circuit as it is, but outputs a logical value stored in the latch circuit. Thereby, it is possible to prevent an input signal of the rear-stage domino logic circuit from being destroyed by the precharge operation of the pre-stage domino logic circuit.

In order for the above-mentioned conventional domino logic circuit to operate correctly, it is necessary that the sum of an evaluation period of the domino logic circuit 510 and a delay time of the latch circuit 540 is shorter than a half of a cycle time of each of the clock signals $\phi$ 1 and $\phi$ 2. That is, when it is assumed that a cycle time of the clock signals $\phi$ 1 and $\phi$ 2 is T, a delay time of the domino logic circuits 510 and 520 is Td, and a delay time of the latch circuits 540 and 550 is T1, it is required that the following relation is satisfied.

$$Td+T1<T/2$$

Details of the conventional dynamic logic circuit is disclosed in detail in "Principles of CMOS VLSI Design: A Systems Perspective", 1988, pp. 138–146.

However, in the above-mentioned conventional domino logic circuit, there was a drawback that an available evaluation period of the domino logic circuit was shortened by the amount corresponding to a phase difference between clock signals at different locations on an integrated circuit, i.e., a clock skew, or by the amount corresponding to a phase fluctuation, i.e., a clock jitter, of a clock signal.

When it is assumed that the amount of the clock skew or the clock jitter is Ts, it is required that the following relation is satisfied in order for the above-mentioned conventional domino logic circuit to operate correctly.

$$Td+T1+Ts<T/2$$

That is, the cycle time must have a value which satisfies the following relation.

$$T>2Td+2T1+2Ts$$

This means that number of circuit stages of domino logic elements which can be disposed in a clock cycle is decreased by the clock skew and/or the clock jitter. In other words, it is necessary to lower an operating frequency to extend a cycle time by the amount of the clock skew and/or the clock jitter.

Also, in the convention domino logic circuit, since two latch circuits are required in one cycle, the delay time of the latch circuits shortens the available evaluation period of the domino logic circuit.

Therefore, the conventional domino logic circuit has drawbacks that an effective time in a clock cycle available as an evaluation period of a domino logic circuit is decreased due to the clock skew, the clock jitter and the delay time of the latch circuit and, as a result thereof, an operating speed of the domino logic circuit is deteriorated.

SUMMARY OF THE INVENTION

Therefore, it is an object of the present invention to provide a dynamic logic circuit and a domino logic element which can operate at high speed.

It is another object of the present invention to provide a dynamic logic circuit and a domino logic element which can effectively avoid influence of a clock skew, a clock jitter or a delay time of a latch circuit and which can operate at high speed.

It is still another object of the present invention to provide a dynamic logic circuit and a domino logic element which can avoid reduction of an effective cycle time usable for an evaluation period of the domino logic circuit caused by a clock skew, a clock jitter or a delay time of a latch circuit.

It is still another object of the present invention to provide a domino logic element which can autonomously determine an end of a precharge period and a start timing of evaluation and which can avoid reduction of effective cycle time usable for an evaluation period of the domino logic circuit caused by a clock skew, a clock jitter or a delay time of a latch circuit, thereby realizing a high speed dynamic logic circuit.

It is still another object of the present invention to provide a dynamic logic circuit which does not require a latch circuit between domino logic circuits, thereby realizing a high speed dynamic logic circuit.

It is still another object of the present invention to obviate the disadvantages of a conventional domino logic element and a dynamic logic circuit.

According to an aspect of the present invention, there is provided a dynamic logic element comprising: a dynamic logic circuit portion producing an output signal in response to an input signal by performing a precharge operation and a discharge operation at a dynamic node; and a detecting circuit portion which stops the precharge operation at the dynamic node when a potential level of the dynamic node reaches a predetermined potential level.

In this case, it is preferable that the detecting circuit portion starts an evaluation phase immediately after an end of the precharge operation.

It is also preferably that the detecting circuit portion comprises: a MOS transistor of a first channel type, for example, a p-type MOS transistor, which has a source terminal coupled to a power supply terminal, a gate terminal coupled to an output terminal of the dynamic logic element, and a drain terminal coupled to a dynamic node for retaining a precharge condition; and a MOS transistor of a second channel type, for example, an n-type MOS transistor, which has a drain terminal coupled to the dynamic node for retaining a precharge condition, a gate terminal coupled to a clock input terminal of the dynamic logic element, and a source terminal coupled to the ground terminal, the second channel type being opposite to the first channel type.

It is further preferably that the dynamic logic element comprises a first channel type MOS transistor for precharging, a plurality of second channel type MOS transistors constituting a MOS logic network, a second channel type MOS transistor for discharging and an inverter element; wherein the first channel type MOS transistor for precharging has a source terminal coupled to a power supply terminal, a gate terminal coupled to the dynamic node for retaining a precharge condition, and a drain terminal coupled to a dynamic node for retaining an output signal; wherein a main current path of the MOS logic network is coupled between the dynamic node for retaining an output signal and a drain terminal of the second channel type MOS transistor for discharging; wherein a source terminal of the second channel type MOS transistor for discharging is coupled to the ground terminal, and a gate terminal of the second channel type MOS transistor is coupled to the dynamic node for retaining a precharge condition; and wherein an input of the inverter element is coupled to the dynamic node for retaining an output signal, and an output of the inverter element is coupled to the output terminal.

It is advantageous that the dynamic logic element comprises a first channel type MOS transistor for precharging, a plurality of second channel type MOS transistors constituting a MOS logic network, and an inverter element; wherein the first channel type MOS transistor for precharging has a source terminal coupled to a power supply terminal, a gate terminal coupled to the dynamic node for retaining a precharge condition, and a drain terminal coupled to a dynamic node for retaining an output signal; wherein a main current path of the MOS logic network is coupled between the dynamic node for retaining an output signal and the ground terminal; and wherein an input of the inverter element is coupled to the dynamic node for retaining an output signal, and an output of the inverter element is coupled to the output terminal.

It is also advantageous that, in the detecting circuit portion, a current drive ability of the MOS transistor of a first channel type is larger than a current drive ability of the MOS transistor of a second channel type.

It is further advantageous that the clock signal inputted to the clock signal input terminal of the dynamic logic element is a pulse-like clock signal having a duty cycle smaller than 50 percent.

It is preferable that, upon detection of completion of a precharge operation, the detecting circuit portion isolates between a power supply terminal and a dynamic node for retaining an output signal, thereby terminating a precharge phase.

It is also preferably that, upon detection of completion of a precharge operation, the detecting circuit portion isolates between a power supply terminal and a dynamic node for retaining an output signal, thereby terminating a precharge phase and simultaneously starts an evaluation phase for determining an output value of the dynamic logic element based on input signals applied to input terminals of the domino logic element.

According to another aspect of the present invention, there is provided a domino logic circuit for use in a dynamic logic circuit, the domino logic circuit comprises: a plurality of domino logic elements which are coupled in tandem and in which a common clock signal is supplied to clock input terminals of the plurality of domino logic elements; wherein each of the domino logic elements comprises a detecting circuit portion which receives an output signal of the domino logic element fed back thereto, which detects completion of a precharge operation, and which, upon detection of completion of a precharge operation, finishes a precharge phase.

In this case, it is preferable that the detecting circuit portion in each of the domino logic elements starts an evaluation phase immediately after an end of the precharge phase.

It is also preferable that the detecting circuit portion in each of the domino logic elements comprises: a MOS transistor of a first channel type which has a source terminal coupled to a power supply terminal, a gate terminal coupled to an output terminal of the domino logic element, and drain terminal coupled to dynamic node for retaining a precharge condition; and a MOS transistor of a second channel type which has a drain terminal coupled to the dynamic node for retaining a precharge condition, a gate terminal coupled to a clock input terminal of the domino logic element, and a source terminal coupled to the ground terminal, the second channel type being opposite to the first channel type.

It is further preferable that, among the plurality of domino logic elements coupled in tandem, the domino logic element at the mots front stage comprises: a first channel type MOS transistor for precharging, a plurality of second channel type MOS transistors constituting a MOS logic network, a second channel type MOS transistor for discharging and an inverter element; wherein the first channel type MOS transistor for precharging has a source terminal coupled to a power supply terminal, a gate terminal coupled to the dynamic node for retaining a precharge condition, and a drain terminal coupled to a dynamic node for retaining an output signal; wherein a main current path of the MOS logic network is coupled between the dynamic node for retaining an output signal and a drain terminal of the second channel type MOS transistor for discharging; wherein a source terminal of the second channel type MOS transistor for discharging is coupled to the ground terminal, and a gate terminal of the second channel type MOS transistor is coupled to the dynamic node for retaining a precharge condition; wherein an input of the inverter element is coupled to the dynamic node for retaining an output signal, and an output of the inverter element is coupled to the output terminal; wherein, among the plurality of domino logic elements coupled in tandem, each of the domino logic elements at the second stage and the stage thereafter comprises a first channel type MOS transistor for precharging, a plurality of second channel type MOS transistors constituting a MOS logic network, and an inverter element; wherein the first channel type MOS transistor for precharging has a source terminal coupled to a power supply to a power supply terminal, a gate terminal coupled to the dynamic node for retaining a precharge condition, and a drain terminal coupled to a dynamic node for retaining an output signal; wherein a main current path of the MOS logic network is coupled between the dynamic node for retaining an output signal and the ground terminal; and wherein an input of the inverter element is coupled to the dynamic node for retaining an output signal, and an output of the inverter element is coupled to the output terminal.

It is advantageous that each of all of the plurality of domino logic elements coupled in tandem comprises a first channel type MOS transistor for precharging, a plurality of second channel type MOS transistors constituting a MOS logic network, a second channel type MOS transistor for discharging and an inverter element; wherein the first channel type MOS transistor for precharging has a source terminal coupled to a power supply terminal, a gate terminal coupled to the dynamic node for retaining a precharge condition, and a drain terminal coupled to a dynamic node for retaining an output signal; wherein a main current path of the MOS logic network is coupled between the dynamic node for retaining an output signal and a drain terminal of the second channel type MOS transistor for discharging; wherein a source terminal of the second channel type MOS transistor for discharging is coupled to the ground terminal, and a gate terminal of the second channel type MOS transistor is coupled to the dynamic node for retaining a precharge condition; and wherein an input of the inverter element is coupled to the dynamic node for retaining an output signal, and an output of the inverter element is coupled to the output terminal.

It is also advantageous that each of all of the domino logic elements coupled in tandem comprises a first channel type MOS transistor for precharging, a plurality of second channel type MOS transistors constituting a MOS logic network, and an inverter element; wherein the first channel type MOS transistor for precharging has a source terminal coupled to a power supply terminal, a gate terminal coupled to the dynamic node for retaining a precharge condition, and a drain terminal coupled to a dynamic node for retaining an output signal; wherein a main current path of the MOS logic network is coupled between the dynamic node for retaining an output signal and the ground terminal; wherein an input of the inverter element is coupled to the dynamic node for retaining an output signal, and an output of the inverter element is coupled to the output terminal; and wherein logic signals supplied from external renders the MOS logic network open circuit condition during the precharge phase.

According to still another aspect of the present invention, there is provided a dynamic logic circuit comprising: N domino logic circuits coupled in tandem, where N is a positive integer; wherein each of the domino logic circuit comprises a plurality of domino logic elements which are coupled in tandem and in which a common clock signal is supplied to clock input terminals of the plurality of domino logic elements in one domino logic circuit; wherein the phase of a clock signal inputted to a domino logic circuit lags behind the phase of a clock signal inputted to a domino logic circuit at the preceding stage by 360/N degrees; and wherein each of the domino logic elements constituting each of the domino logic circuits comprises a detecting circuit portion which receives an output signal of the domino logic element fed back thereto, which detects completion of a precharge operation, and which, upon detection of completion of a precharge operation, finishes a precharge phase.

In this case, it is preferable that adjacent domino logic circuits of the N domino logic circuits are coupled in tandem without interposing a buffer circuit therebetween.

It is also preferable that, in at least one of the domino logic circuits, among the plurality of domino logic elements coupled in tandem, the domino logic element at the most front stage comprises: a first channel type MOS transistor for precharging, a plurality of second channel type MOS transistors constituting a MOS logic network, a second channel type MOS transistor for discharging and an inverter element; wherein the first channel type MOS transistor for precharging has a source terminal coupled to a power supply terminal, a gate terminal coupled to the dynamic node for retaining a precharge condition, and a drain terminal coupled to a dynamic node for retaining an output signal; wherein a main current path of the MOS logic network is coupled between the dynamic node for retaining an output signal and a drain terminal of the second channel type MOS transistor for discharging; wherein a source terminal of the second channel type MOS transistor for discharging is coupled to the ground terminal, and a gate terminal of the second channel type MOS transistor is coupled to the dynamic node for retaining a precharge condition; wherein an input of the inverter element is coupled to the dynamic node for retaining an output signal, and an output of the inverter element is coupled to the output terminal; wherein, in the at least one of the domino logic circuits, among the plurality of domino logic elements coupled in tandem, each of the domino logic elements at the second stage and the stage thereafter comprises a first channel type MOS transistor for precharging, a plurality of second channel type MOS transistors constituting a MOS logic network, and an inverter element; wherein the first channel type MOS transistor for precharging has a source terminal coupled to a power supply terminal, a gate terminal coupled to the dynamic node for retaining a precharge condition, and a drain terminal coupled to a dynamic node for retaining an output signal; wherein a main current path of the MOS logic network is coupled between the dynamic node for retaining an output signal and the ground terminal; and wherein an input of the inverter element is coupled to the dynamic node for retaining an output signal, and an output of the inverter element is coupled to the output terminal.

In the dynamic logic circuit and in the domino logic element according to the present invention constituted as mentioned above, a timing of start of precharge phase is determined by a clock signal, but a timing of end of precharge and start of evaluation is autonomously determined by the domino logic element itself. Therefore, the timing of end of precharge and start of evaluation is not affected by clock skew and/or clock jitter (referred to as clock skew as a whole). Thus, according to the present invention, loss of an effective cycle time is not caused by the clock skew.

Also, since precharge operation is independently performed in a plurality of domino logic elements constituting a domino logic circuit, the precharge operation finishes earlier than evaluation. Thus, in the dynamic logic circuit having a plurality of domino logic circuits coupled in tandem, an evaluation of a domino logic circuit in a rear stage starts at a timing earlier than a start of precharge phase of a domino logic circuit in a front stage, and thus a latch circuit is not required between the domino logic circuits. Therefore, loss of effective cycle time caused by the delay of the latch circuit does not occur.

BRIEF DESCRIPTION OF THE DRAWINGS

These and other features, and advantages, of the present invention will be more clearly understood from the following detailed description taken in conjunction with the accompanying drawings, in which like reference numerals designate identical or corresponding parts throughout the figures, and in which:

FIG. 8A through FIG. 8J are timing diagrams showing waveforms of various portions of the logic circuit shown in FIG. 7 and used for explaining an operation thereof;

DESCRIPTION OF A PREFERRED EMBODIMENT

With reference to the drawings, embodiments of the present invention will now be described in detail.

Figure 1:
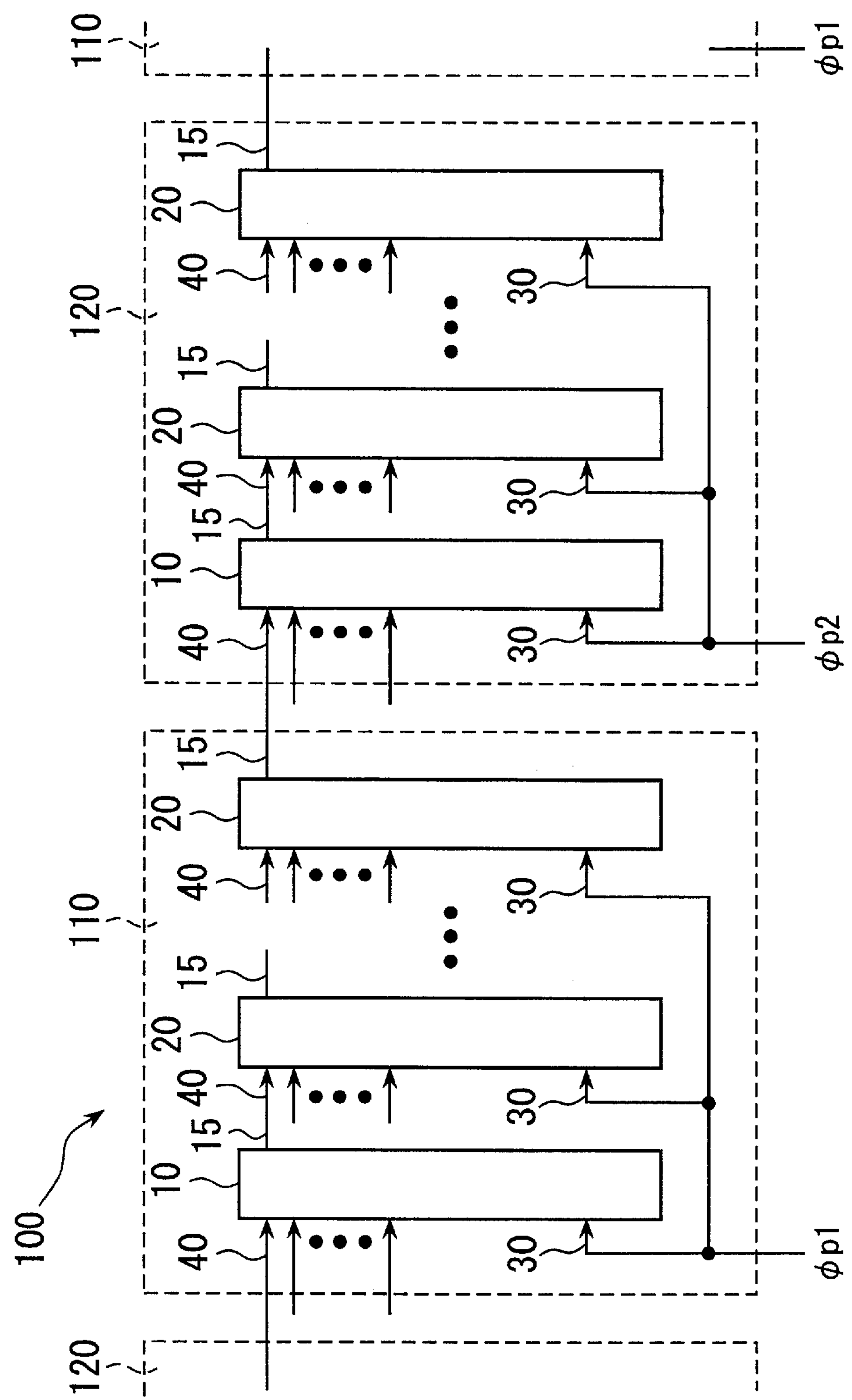
FIG. 1 is a block circuit diagram showing a structure of a logic circuit realized by using domino logic circuits according to an embodiment of the present invention.

FIG. 1 shows a structure of a dynamic logic circuit realized by using domino logic circuits according to an embodiment of the present invention. The dynamic logic circuit 100 of FIG. 1 comprises an alternate and tandem connection of a domino logic circuit 110 according to an embodiment of the present invention to which a clock signal ϕ p1 is inputted, and a domino logic circuit 120 according to an embodiment of the present invention to which a clock signal ϕ p2 is inputted. Each of the domino logic circuits 110 and 120 comprises a tandem connection of one or more domino logic elements 10 each of which is a first type domino logic element and one or more domino logic elements 20 each of which is a second type domino logic element. Details of the dynamic logic circuit 100, the domino logic circuits 110 and 120, the first and second domino logic elements 10 and 20, and the like will be described below.

Figure 2:
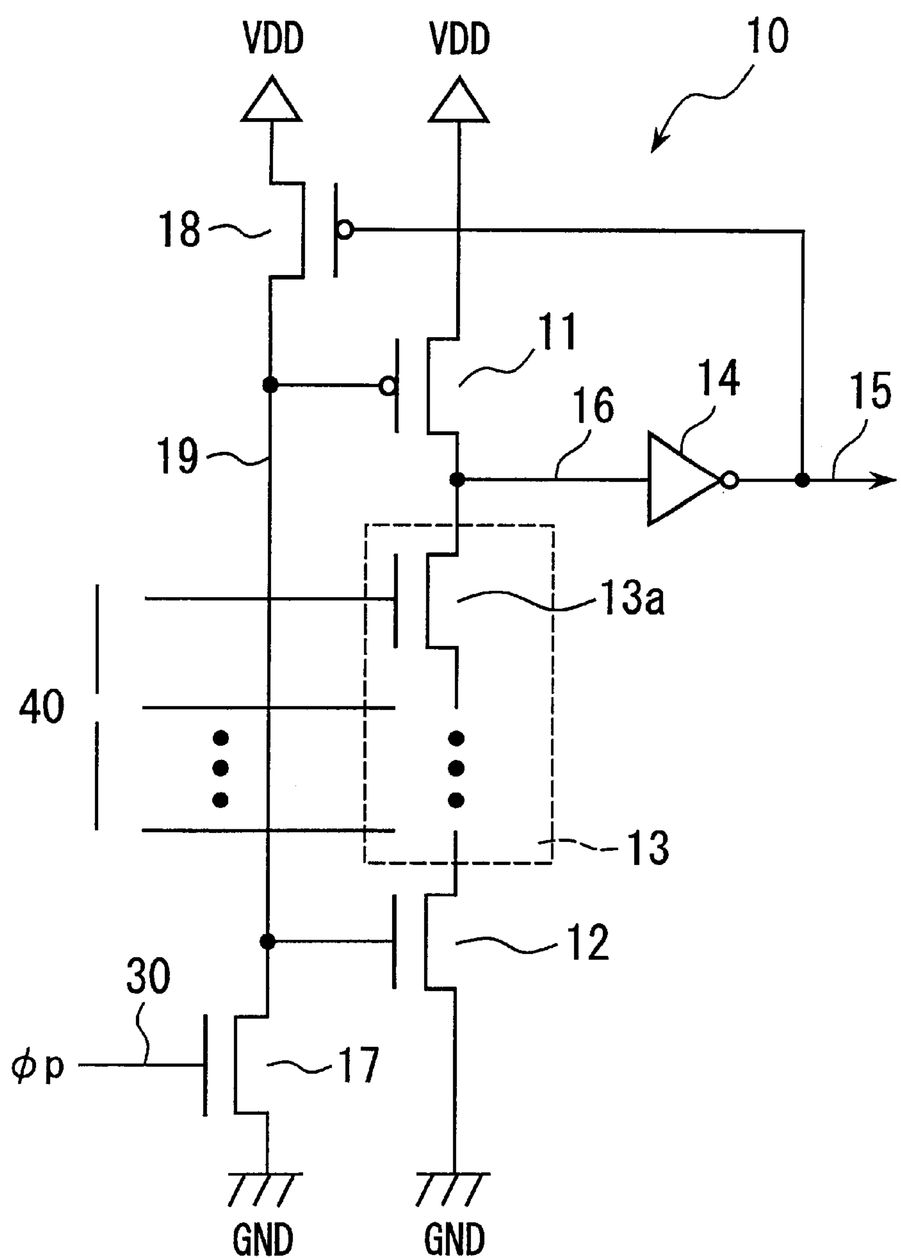
FIG. 2 is a circuit diagram showing a structure of a first type domino logic element used for constituting a domino logic circuit according to an embodiment of the present invention.

FIG. 2 is a circuit diagram showing a structure of the first type domino logic element 10 used in the domino logic circuits 110 and 120 according to the present invention. As shown in FIG. 2, the first type domino logic element 10 comprises a p-type MOS transistor 11 for precharging, an n-type MOS transistor 12 for discharging, an n-type MOS transistor logic network (hereafter referred to as an nMOS logic network) 13, an output inverter 14, an n-type MOS transistor 17 for starting precharge, and a p-type MOS transistor 18 for finishing precharge. FIG. 2 only shows a structure characteristic of the present invention.

The source terminal of the p-type MOS transistor 11 is coupled to a power supply terminal VDD, the gate terminal thereof is coupled to a dynamic node 19, and the drain terminal thereof is coupled to a dynamic node 16. The p-type MOS transistor 11 functions to precharge the dynamic node 16, based on a logical potential level of the dynamic node 19.

The nMOS logic network 13 comprises a plurality of n-type MOS transistors 13*a* whose gate terminals are coupled to signal input terminals 40. The nMOS logic network 13 are disposed between the dynamic node 16 and the n-type MOS transistor 12 for discharging. That is, the main current path of the nMOS logic network 13 is coupled between the dynamic node 16 and the drain terminal of the n-type MOS transistor 12 for discharging. Depending on the connection of the n-type MOS transistors 13*a* in the nMOS logic network 13, the domino logic element 10 performs a desired logical function.

The drain terminal of the n-type MOS transistor 12 for discharging is coupled to the nMOS logic network 13, the gate terminal thereof is coupled to the dynamic node 19, and the source terminal thereof is coupled to the ground terminal GND. The n-type MOS transistor 12, together with the nMOS logic network 13, function to discharge electric charges stored in the dynamic node 16, based on the logical potential level of the dynamic node 19.

The output inverter 14 inverts a logical potential of the dynamic node 16, and outputs an inverted logical potential to an output terminal 15.

The drain terminal of the n-type MOS transistor 17 for starting precharge is coupled to the dynamic node 19, the gate terminal thereof is coupled to a clock input terminal 30, and the source terminal thereof is coupled to the ground terminal GND. The n-type MOS transistor 17 is turned on and off based on a clock signal ϕ p inputted from the clock input terminal 30. When turned on, the n-type MOS transistor 17 for starting precharge makes a logical potential level of the dynamic node 19 a LOW potential level (L level).

The drain terminal of the p-type MOS transistor 18 for finishing precharge is coupled to the dynamic node 19, the gate terminal thereof is coupled to an output of the domino logic element 10, and the source terminal thereof is coupled to the power supply terminal VDD. The p-type MOS transistor 18 for finishing precharge is turned on and off based on a logical potential of the output terminal 15. When turned on, the p-type MOS transistor 18 for finishing precharge makes a logical potential level of the dynamic node 19 a HIGH potential level (H level). It should be noted that a current drive ability of the p-type MOS transistor 18 for finishing precharge is made larger than the current drive ability of the n-type MOS transistor 17 for starting precharge. The current drive ability of the transistors can be adjusted, for example, by changing a gate width of each transistor.

Figure 10:
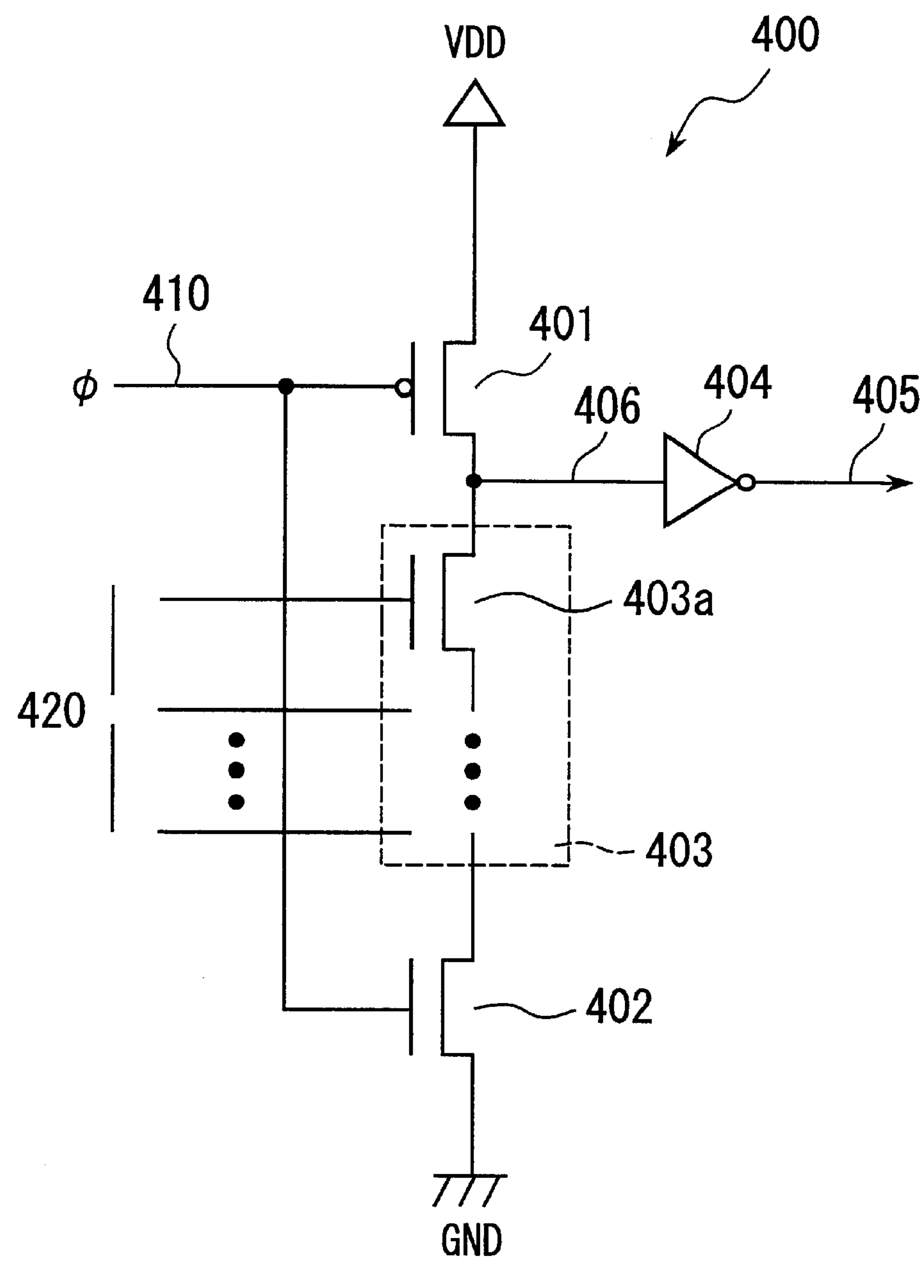
FIG. 10 is a circuit diagram showing a structure of a conventional domino logic element.

As mentioned above, the domino logic element 10 of FIG. 2 has a structure in which the n-type MOS transistor 17 for starting precharge and the p-type MOS transistor 18 for finishing precharge are added to the conventional domino logic element 400 shown in FIG. 10.

Figures 3A, 3B, 3C:
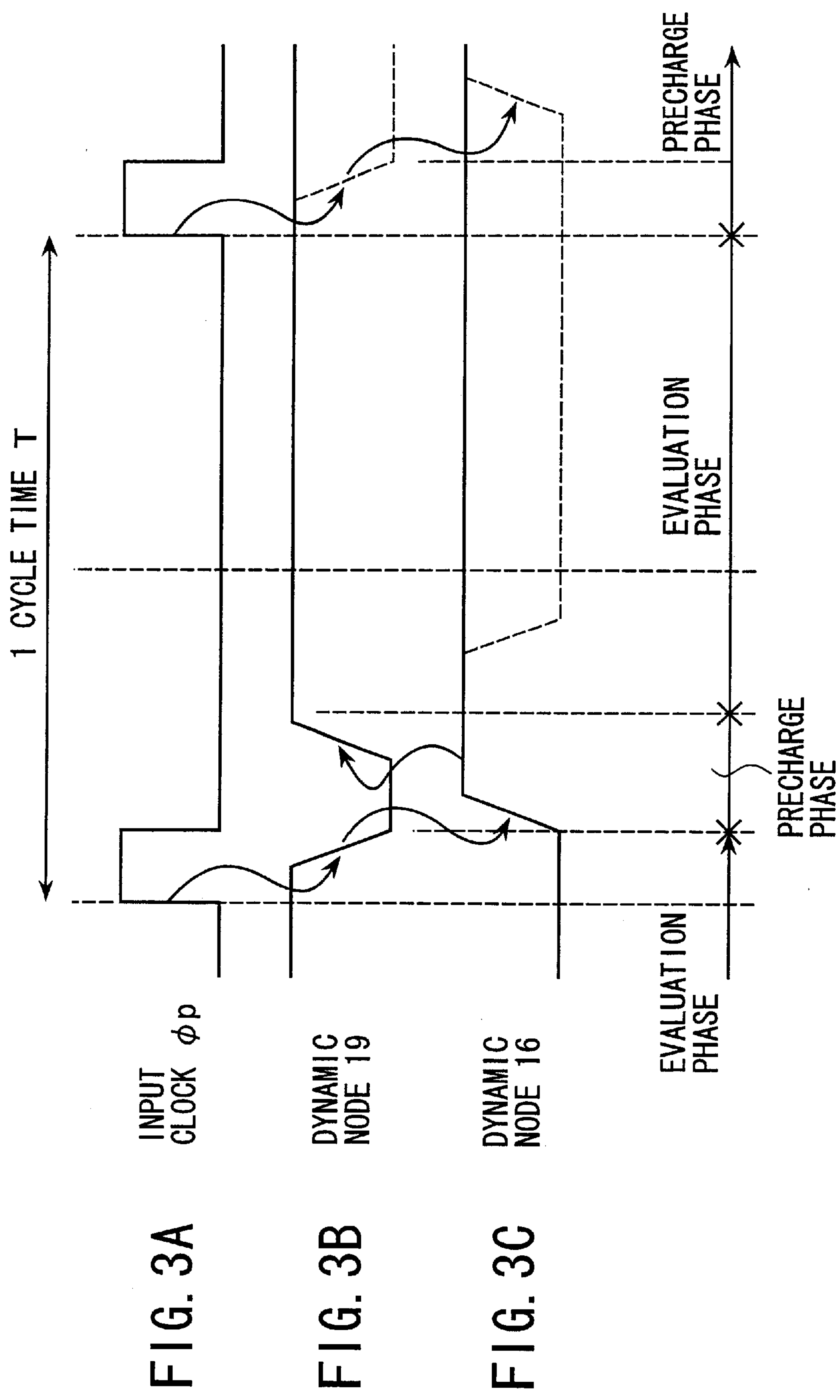
FIG. 3A, FIG. 3B and FIG. 3C are timing diagrams showing waveforms of various portions of the domino logic element shown in FIG. 2 and used for explaining an operation thereof.

FIG. 3A through FIG. 3C are timing charts illustrating an operation of the domino logic element 10 shown in FIG. 2. As shown in FIG. 3A, the input terminal 30 of the domino logic element 10 receives a pulse-like clock signal ϕ p whose high potential level period is shorter than a half (T/2) of the cycle time (T) of the clock signal ϕ p. When, in the domino logic element 10, the dynamic node 16 is discharged according to the evaluation of the previous cycle and therefore an output terminal 15 is in H level, the p-type MOS transistor 18 for finishing precharge is in a turned off condition.

When the clock signal ϕ p becomes H level and a precharge period is started, the n-type MOS transistor 17 for starting precharge is turned on. Therefore, the dynamic node 19 and the ground terminal GND is short-circuited, and the potential of the dynamic node 19 is discharged to a LOW potential level (L level). When the potential of the dynamic node 19 becomes L level, the p-type MOS transistor 11 is turned on and the n-type MOS transistor 12 is turned off. Therefore, the dynamic node 16 is short-circuited with the power supply terminal VDD and is isolated from the ground terminal GND. As a result thereof, the dynamic node 16 is precharged to H level.

In response to the transition of the potential of the dynamic node 16 from L level to H level, the potential of the output terminal 15 changes to L level, and the p-type MOS transistor 18 for finishing precharge is turned on. In this time, if the potential of the clock signal ϕ p has already been in L level, the n-type MOS transistor 17 for starting precharge is in a turned off condition. On the other hand, if the potential of the clock signal ϕ p is still in H level, the n-type MOS transistor 17 for starting precharge is still in a turned on condition.

When the n-type MOS transistor 17 for starting precharge is already in a turned off condition, the dynamic node 19 is short-circuited with the power supply terminal VDD, and is isolated from the ground terminal GND, so that the dynamic node 19 is again precharged to H level. On the other hand, when the n-type MOS transistor 17 for starting precharge is still in a turned on condition, the dynamic node 19 is short-circuited simultaneously with the power supply terminal VDD and the ground terminal GND. However, as mentioned before, the drive ability or capacity of the p-type MOS transistor 18 for finishing precharge is made larger than that of the n-type MOS transistor 17 for starting precharge. Therefore, the dynamic node 19 is again precharged to H level. As a result, the p-type MOS transistor 11 for precharging is turned off, and the n-type MOS transistor 12 for discharging is turned on. Thus, the domino logic element 10 starts an evaluation period, simultaneously with the end of a precharge period.

In the evaluation period, the dynamic node 16 is selectively discharged or not discharged, based on input signals applied to the signal input terminals 40. When the dynamic node is not discharged, the potential of the dynamic node 16 remains H level and the potential of the clock signal ϕ p becomes H level, so that the n-type MOS transistor 17 for starting precharge is turned on and the precharge period starts. In this case, since the output signal at the output terminal 15 is in L level, the p-type MOS transistor 18 for finishing precharge is also turned on. Therefore, the dynamic node 19 is short-circuited simultaneously with the power supply terminal VDD and the ground terminal GND. However, since the drive ability or capacity of the p-type MOS transistor 18 for finishing precharge is made larger than that of the n-type MOS transistor 17 for starting precharge, the dynamic node 19 remains H level. As a result, the dynamic node 19 remains H level and the potential of the clock signal ϕ p becomes L level, so that the precharge period finishes.

As mentioned above, in the domino logic circuit according to the present invention, a precharge period or phase is started at the time when the clock signal ϕ p becomes H level, by the n-type MOS transistor 17 for starting precharge to which the pulse like clock signal ϕ p is applied. Also, the precharge period is finished autonomously by the p-type MOS transistor 18 for finishing precharge to which an output of the domino logic circuit itself is applied, and an evaluation period or phase is started simultaneously. It is only necessary that the H level period, i.e., the pulse width, of the clock signal ϕ p which is applied to the n-type MOS transistor 17 for starting precharge has a width sufficient for the n-type MOS transistor 17 for starting precharge to discharge the dynamic node 19 to L level.

The capacities of the dynamic node 19 is dominated by the gate capacitance of the p-type MOS transistor 11 for precharge, the gate capacitance of the n-type MOS transistor 12 for discharge, the drain capacitance of the n-type MOS transistor 17 for starting precharge, and the drain capacitance of the p-type MOS transistor 18 for finishing precharge. The capacitance of the dynamic node 19 is much smaller than the capacitance of the dynamic node 16, which is actually precharged, and the input capacitance of the next stage logic element. Also, the capacitance of the dynamic node 19 does not depend on the structure of the nMOS logic network 13 and connection of the domino logic elements. Therefore, the capacitance of the dynamic node 19 is substantially constant among domino logic elements. As a result, it becomes possible to sufficiently shorten the pulse width of the clock signal ϕ p, when compared with T/2 which is a half of the cycle time.

Figure 4:
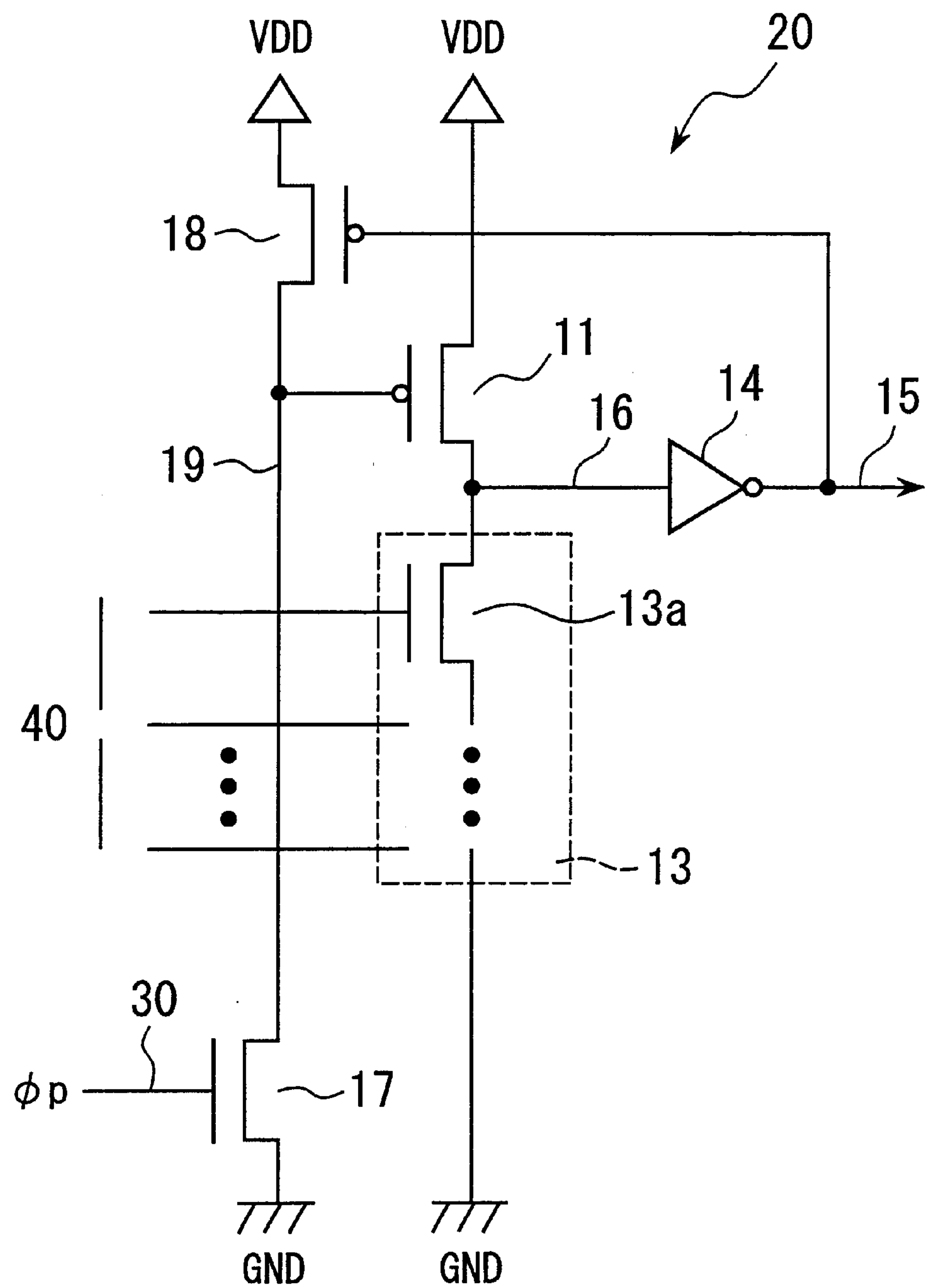
FIG. 4 is a circuit diagram showing a structure of a second type domino logic element used for constituting a domino logic circuit according to an embodiment of the present invention.

FIG. 4 is a circuit diagram showing a structure of a second type domino logic element 20 used in the domino logic circuits 110 and 120 according to the present invention. As shown in FIG. 4, the second type domino logic element 20 comprises a p-type MOS transistor 11 for precharge, an n-type MOS transistor logic network (nMOS logic network) 13, an output inverter 14, an n-type MOS transistor 17 for starting precharge, and a p-type MOS transistor 18 for finishing precharge. A current drive ability or capacity of the p-type MOS transistor 18 for finishing precharge is made larger than a current drive ability or capacity of the n-type MOS transistor 17 for starting precharge. The current drive ability of the transistors can be adjusted, for example, by changing a gate width of each transistor. That is, the second domino logic element 20 has a structure in which the n-type MOS transistor 12 for discharge is omitted from the first domino logic element 10 shown in FIG. 2. FIG. 4 mainly shows a structure characteristic of the present embodiment, and illustration of a structure of other portions is omitted.

The domino logic element 20 does not have a n-type MOS transistor for discharging such as the n-type MOS transistor 12 for discharging of the first domino logic element 10, and therefore an electric resistance from the dynamic node 16 to the ground terminal GND can be reduced by the amount of the resistance of the n-type MOS transistor for discharging. Therefore, in the evaluation period, the discharge of the dynamic node 16 can be performed at high speed. As a result, the domino logic element 20 can operate at higher speed than the domino logic element 10.

On the other hand, with respect to a precharge period, the n-type MOS transistor for discharging such as the n-type MOS transistor 12 for discharging which isolates the dynamic node 16 and the ground terminal GND does not exist. Therefore, in order for the dynamic node 16 to be precharged, it is necessary that input signals inputted from the signal input terminals 40 are L level and n-type MOS transistors 13*a* constituting the nMOS logic network 13 are turned off and, thereby, the dynamic node 16 and the ground terminal GND are isolated from each other. If all pre-stage logic elements coupled to the signal input terminals 40 are domino logic elements, in a precharge period, output signals of the pre-stage logic elements become L level by the precharge. Thereby, the input signals inputted to the signal input terminals 40 become L level and the above-mentioned condition is satisfied. That is, the precharge of the dynamic node 16 can be completed, only when the dynamic node 16 and the ground terminal GND are isolated.

Referring again to FIG. 1, each of the domino logic circuits 110 and 120 comprises one or more first type domino logic elements 10 and one or more second type domino logic elements 20 coupled in tandem. As a basic structure, a first stage domino logic element which receives an input signal from outside is composed of the first type domino logic element 10 having the n-type MOS transistor 12 for discharging, and domino logic element of a second stage and thereafter are composed of the second type domino logic elements 20 each of which does not have the n-type MOS transistor 12 for discharging. That is, in each of the domino logic circuits 110 and 120, an input signal from external is inputted to the input of the domino logic element 10. The output of the domino logic element 10 is coupled to the domino logic element 20. The output of the domino logic element 20 is coupled to the input of another domino logic element 20 or is outputted from the domino logic circuit 110 or 120 to external.

If the delay of time required for the discharge of the dynamic node 16 caused by the n-type MOS transistor 12 for discharging does not matter, it is possible to use the domino logic element 10 in place of the domino logic element 20, as the domino logic elements of the second stage and/or the stage thereafter. Also, if the input signal inputted from external to the domino logic circuit 110 or the domino logic circuit 120 are guaranteed to become L level in a precharge period of the domino logic circuit 110 or the domino logic circuit 120, it is also possible to use the second type domino logic element 20 in place of the first type domino logic element 10, as the first stage domino logic element which is directly coupled to an input signal from outside.

Figures 5A, 5B, 5C, 5D, 5E:
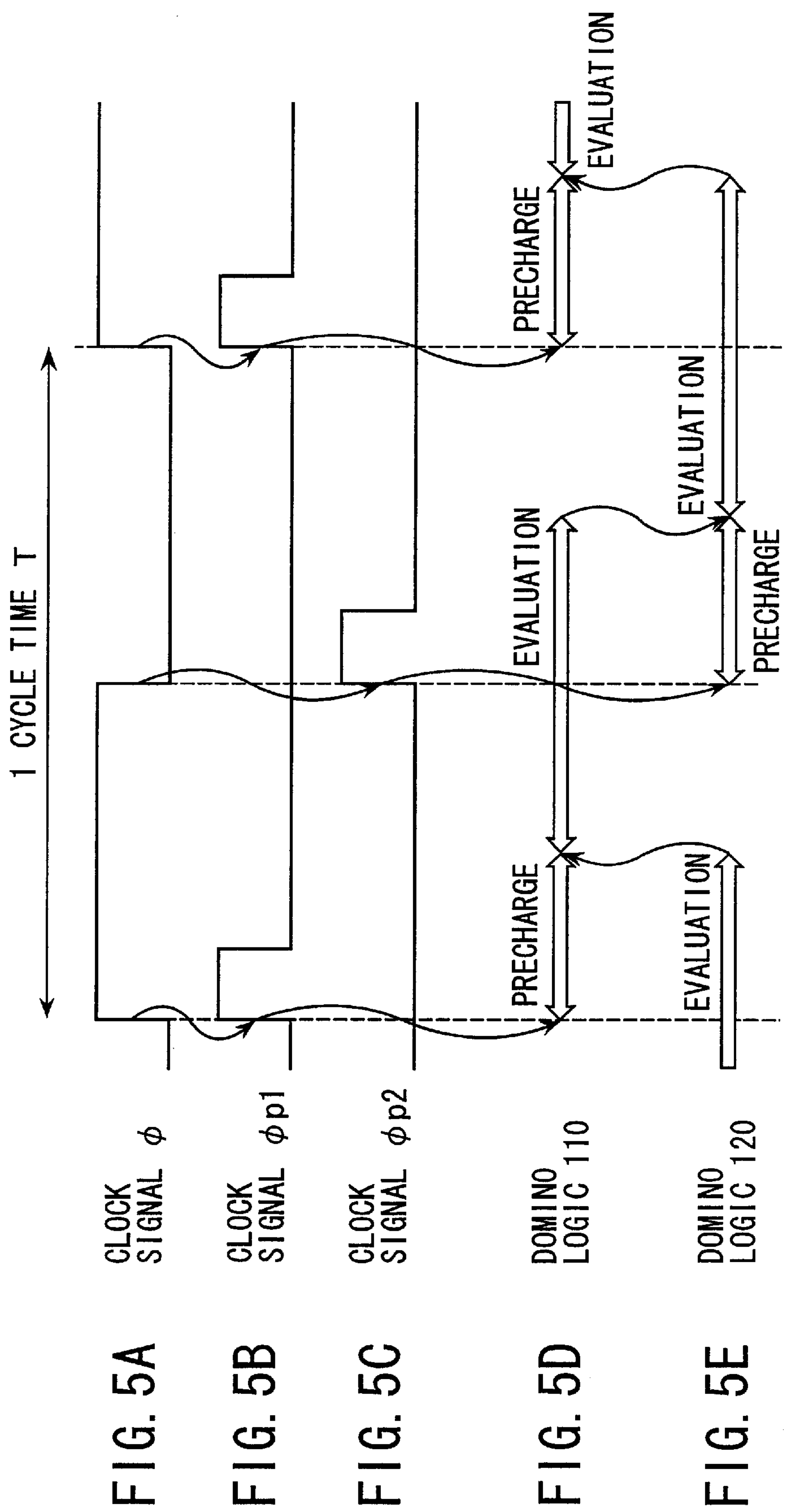
FIG. 5A through FIG. 5E are timing diagrams showing waveforms of various portions of the logic circuit shown in FIG. 1 and used for explaining an operation thereof.

Now, with reference to FIG. 1 and FIG. 5A through FIG. 5E, an explanation will be made on an operation of the logic circuit according to the present invention. FIG. 5A through 5E are timing diagrams showing waveforms of various portions of the logic circuit 100 and used for describing an operation thereof. As shown in FIG. 5B and FIG. 5C, a clock signal ϕ p1 inputted to the domino logic circuit 110 and a clock signal 100 p2 are pulse-like clock signals which have phases mutually different by 180 degrees. Thereby, one domino logic circuit 110 and one domino logic circuit 120 coupled in tandem can perform logical processing within one cycle of a clock signal.

The clock signal ϕ p1 and the clock signal ϕ p2 can be produced respectively from rising edges and falling edges of a clock signal ϕ whose duty cycle is 50 percent, that is, whose high level period and low level period are equal to each other. When the clock signal ϕ p1 becomes H level, the domino logic elements 10 and 20 included in the domino logic circuit 110 start precharge operation. Then, when the precharge operation is completed, each of the domino logic elements 10 and 20 finishes the precharge period autonomously, and enters an evaluation period.

The domino logic element 10 starts evaluation, when an evaluation of the pre-stage logic circuit coupled to the input of the domino logic circuit 10 is completed to establish the input thereto and when the domino logic element 10 itself is in an evaluation phase, and outputs a signal obtained by the evaluation to the domino logic element 20 at the next stage. The domino logic element 20 at the next stage similarly performs evaluation and outputs a signal obtained by the evaluation to the domino logic element 20 of the subsequent stage, and so on. An output of the domino logic element 20 at the final stage is outputted to the domino logic circuit 120 as an output value obtained as a result of evaluation by the domino logic circuit 110. This output value is retained until the clock signal ϕ p1 becomes H level again and precharge of the domino logic elements constituting the domino logic circuit 110 is performed.

Similarly, when the clock signal ϕ p2 becomes H level, the domino logic elements 10 and 20 included in the domino logic circuit 120 start precharge operation. Then, when the precharge operation is completed, each of the domino logic elements 10 and 20 finishes the precharge period autonomously, and enters an evaluation period. Here, the domino logic circuit 120 starts evaluation, when an evaluation of the pre-stage logic circuit 110 is completed and the output thereof is determined, and the domino logic circuit 120 outputs a signal obtained by the evaluation to the domino logic circuit 110 at the subsequent stage.

Figure 11:
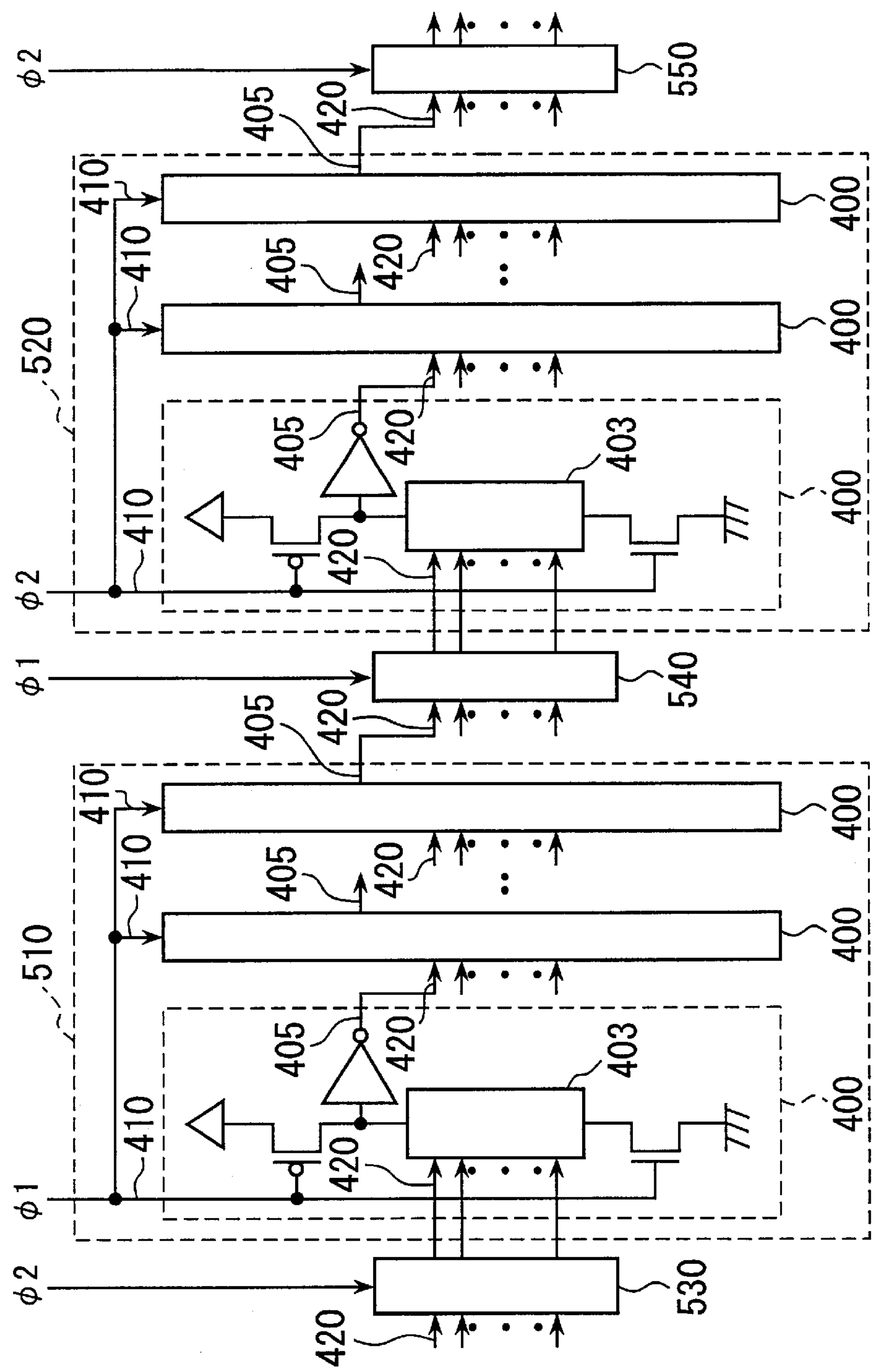
FIG. 11 is a block circuit diagram showing a structure of a logic circuit realized by using domino logic circuits constituted of the conventional domino logic elements shown in FIG. 10.

In the above-mentioned operation, it can be seen that the precharge period is much shorter than a half (T/2) of the cycle time. Therefore, each of the domino logic circuits 110 and 120 can start evaluation before the pre-stage domino logic circuit 120 or 110 starts precharge operation. As a result thereof, it is not necessary to dispose a latch circuit between the domino logic circuits 110 and 120 or between the domino logic circuits 120 and 110. In the domino logic circuit shown in FIG. 11, such a latch circuit is required to retain a result obtained by the evaluation in the previous cycle. Therefore, in the domino logic circuit according to the present invention, an effective period of the cycle time which can be used for an evaluation period is not reduced by the delay time of the latch circuit, so that it is possible to realize a high speed logic circuit.

Figures 6A, 6B, 6C, 6D, 6E:
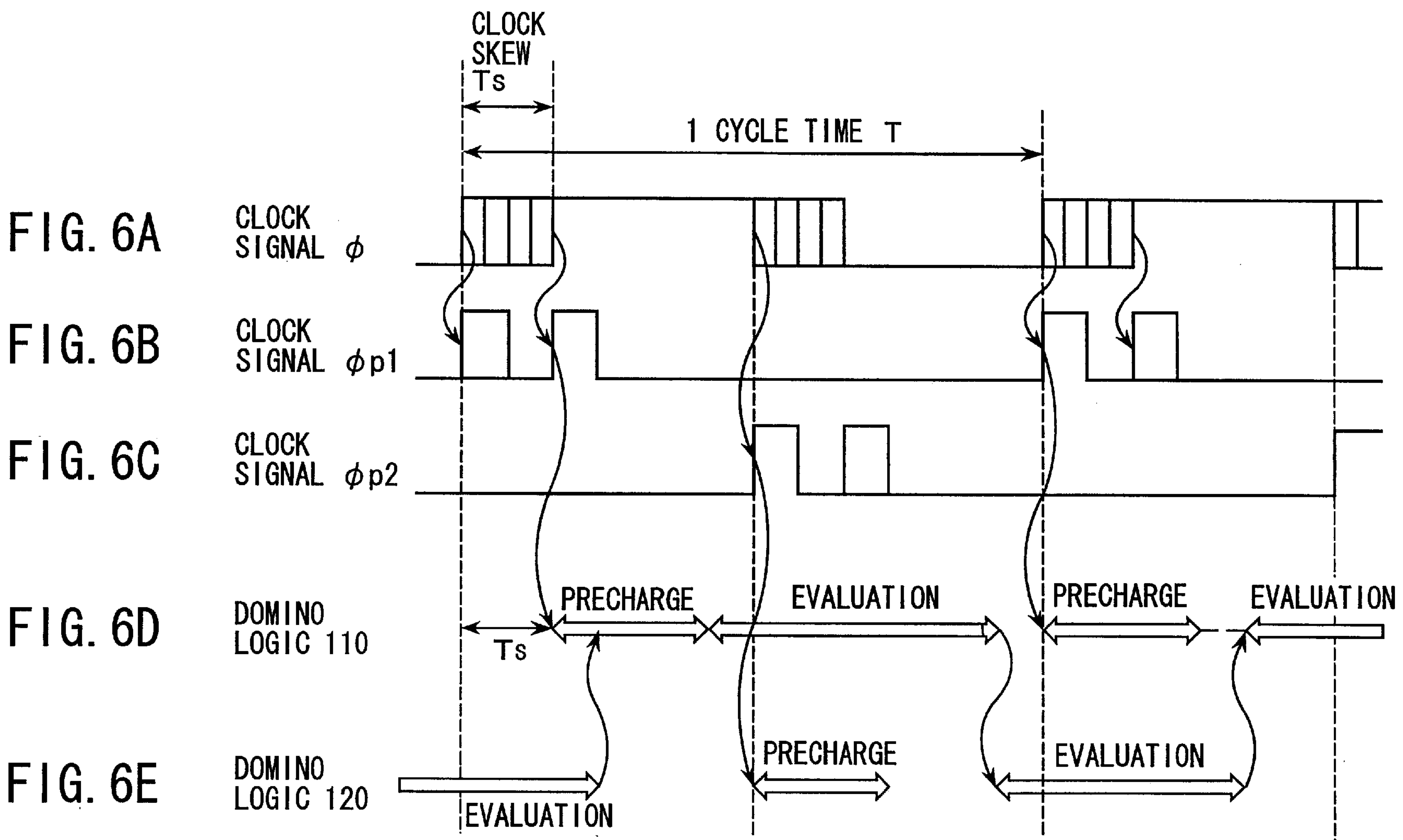
FIG. 6A through FIG. 6E are timing diagrams showing waveforms of various portions of the logic circuit shown in FIG. 1 and used for explaining an operation thereof, when a clock signal has clock skew.

FIG. 6A through 6E are timing diagrams showing waveforms of various portions of the logic circuit 100 and used for describing an operation thereof, on a condition a clock skew having a magnitude Ts exists in the clock signal ϕ. In this case, as shown in FIG. 6A, a rising edge of the clock signal ϕ delays by Ts due to the clock skew. Thereby, a rising time when the clock signal ϕ p1 becomes H level delays by Ts, and similarly the time when the domino logic circuit 110 begins precharge also delays by Ts. As a result thereof, the time when the evaluation of the domino logic circuit 110 finishes also delays by Ts. However, in the present invention, it is not necessary to retain the result of evaluation by using a latch circuit like that of the conventional domino logic circuit. Therefore, as long as the evaluation finishes before the start of the precharge of the next cycle, the result of the evaluation is normally outputted.

The domino logic circuit 120, after finishing a precharge, starts an evaluation period or phase autonomously. Therefore, when receiving an output of the pre-stage domino logic circuit 110, the domino logic circuit 120 can immediately start an evaluation and output the result of the evaluation to the domino logic circuit 110 in the next stage.

In other words, in the domino logic circuits 110 and 120 according to the present invention, even if the clock skew exists, it is possible to normally operate without reducing an effective time in the cycle time, as long as an evaluation of a domino logic circuit finishes before the start of precharge of the next cycle.

Assuming that a delay time of evaluation of each of the domino logic circuits 110 and 120 is Td, a precharge time of each of the domino logic circuits 110 and 120 is Tp, and a magnitude of a clock skew is Ts, the condition an evaluation of a domino logic circuit finishes before the start of a precharge of the next cycle is represented as follows.

$$Ts+Tp+Td<T$$

Since the maximum value of the evaluation time of a domino logic circuit is T/2, the domino logic circuits 110 and 120 can operate in a cycle time T which satisfying the following relations.

$$Ts+Tp+Td<T, \text{ and}$$

$$2Td<T$$

Since the precharge period Tp is much smaller than the evaluation time Td, an allowable magnitude of the clock skew usually becomes a positive value and is represented by the following relation.

$$Ts<T-Tp-Td$$

That is, even if a clock skew exists which has a magnitude:

$$Ts<T-Tp-Td,$$

each of the domino logic circuits 110 and 120 can operate in a cycle time T represented as follows.

$$2Td<T$$

While in the conventional domino logic circuit, the cycle time is limited by the following relation.

$$2Td+2Tl+2Ts<T$$

Therefore, in the present invention, the cycle time can be shorter than that of the conventional domino logic circuit by the amount corresponding to the sum of the delay time of two latch circuits and the double of the clock skew. Even when a precharge time is equal to an evaluation time, that is, even when:

$$Tp=Td,$$

each of the domino logic circuits 110 and 120 can operate in a cycle time shown by the following relation.

$$Ts+Tp+Td=Ts+2Td<T$$

This is because, in the conventional domino logic circuit, a start timing of a precharge phase and a timing of precharge end and start of evaluation are determined by a clock signal and, therefore, the clock skew affects twice in one cycle. On the other hand, in the domino logic circuits 110 and 120 according to the present invention, only the timing of the start of precharge is given by the clock signal, so that the clock skew affects only once in one cycle, and also the latch circuit is not required.

Figure 9:
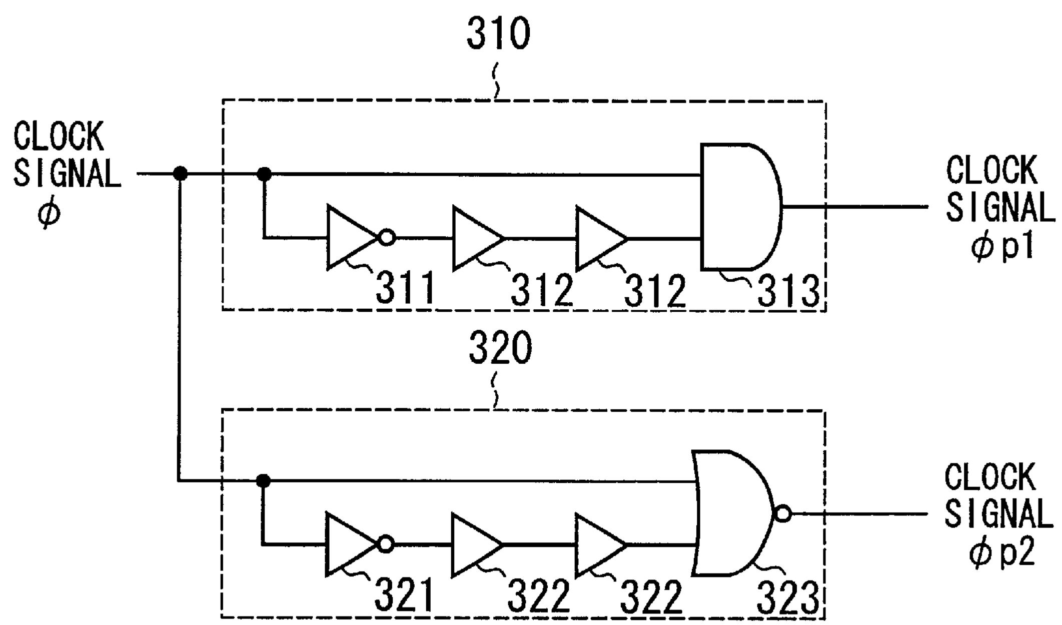
FIG. 9 is a circuit diagram showing a structure of a pulse-like clock generating circuit which generates two kinds of pulse-like clock signals having phases mutually different from each other by 180 degrees.

FIG. 9 is a circuit diagram showing an example of a pulse-like clock signal generating circuit for generating pulse-like clock signals ϕ p1 and ϕ p2 whose phases differ from each other by 180 degrees, from a clock signal ϕ. These clock signals are shown in FIG. 5A through 5C. As shown in FIG. 9, the pulse-like clock signal generating circuit comprises a clock generating circuit unit 310 and a clock generating circuit unit 320.

The clock generating circuit unit 310 produces the clock signal ϕ p1 which becomes H level at a rising edge of the clock signal ϕ, and comprises a NOT gate element, i.e., an inverter element, 311, one or more delay elements 312, and an AND gate element 313. In the clock generating circuit unit 310, the clock signal ϕ is branched, and inputted into one of input terminals of the AND gate element 313 directly and into the NOT gate element 311. The clock signal ϕ inputted into the NOT gate element 311 passes through the one or more delay elements 312 and inputted to the other input of the AND gate element 313. The pulse width of the clock signal ϕ p1 is determined by a delay time from the input of the NOT gate element 311 to the input of the AND gate element 313. Therefore, the pulse width of the clock signal ϕ p1 can be adjusted to a desired value by the number of the one or more delay elements 312.

The clock generating circuit unit 320 produces the clock signal ϕ p2 which becomes H level at a falling edge of the clock signal ϕ, and comprises a NOT gate element, i.e., an inverter element, 321, one or more delay elements 322, and a NOR gate element 323. In the clock generating circuit unit 320, the clock signal ϕ is branched, and inputted into one of input terminals of the NOR gate element 323 directly and into the NOT gate element 321. The clock signal ϕ inputted into the NOT gate element 321 passes through the one or more delay elements 322 and inputted to the other input of the NOR gate element 323. The pulse width of the clock signal ϕ p2 is determined by a delay time from the input of the NOT gate element 321 to the input of the NOR gate element 323. Therefore, the pulse width of the clock signal ϕ p2 can be adjusted to a desired value by the number of the one or more delay elements 322.

As mentioned above, the pulse-like clock signals can be easily produced from a clock signal having a duty cycle of 50 percent. Therefore, it is possible to produce the pulse-like clock signals in the vicinity of a domino logic circuit which uses the pulse-like clock signals.

Figure 7:
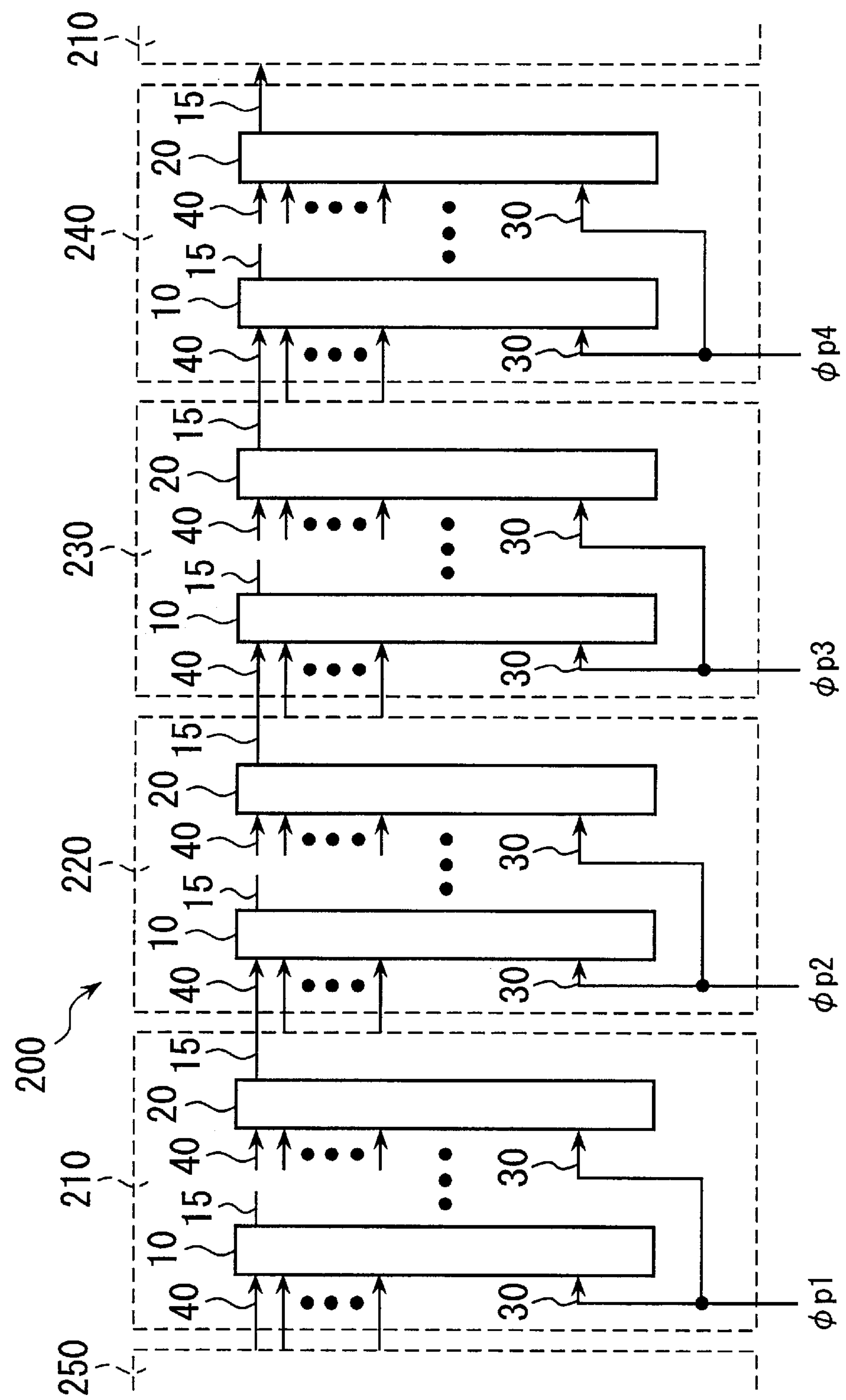
FIG. 7 is a block circuit diagram showing a structure of another logic circuit realized by using domino logic circuits according to an embodiment of the present invention.

In the above, domino logic circuits controlled by the two phase clock signals of the clock signal ϕ p1 and the clock signal ϕ p2 are shown as an embodiment of the present invention. However, the present invention can also be easily applied to domino logic circuits controlled by clock signals having more than two phases. FIG. 7 is a circuit diagram showing a structure of another logic circuit 200 which is composed by using the above-mentioned domino logic circuits and which are controlled by four phase pulse-like clock signals.

The logic circuit 200 of FIG. 7 comprises a sequential tandem connection of a domino logic circuit 210 into which a clock signal ϕ p1 is inputted, a domino logic circuit 220 into which a clock signal ϕ p2 is inputted, a domino logic circuit 230 into which a clock signal ϕ p3 is inputted, and a domino logic circuit 240 into which a clock signal ϕ p4 is inputted. Each of these domino logic circuits 210, 220, 230 and 240 has the same structure as that of the above-mentioned domino logic circuit, i.e., the domino logic circuit 110 or 120. Also, these domino logic circuits 210, 220, 230 and 240 perform logical operation within one cycle of a clock signal. Each of these domino logic circuits 210, 220, 230 and 240 is composed of a tandem connection of one or more domino logic elements 10 and one or more domino logic elements 20, similarly to the domino logic circuit 110 or 120 in FIG. 1.

The clock signals ϕ p1, ϕ p2, ϕ p3 and ϕ p4 are pulse-like clock signals having phases mutually different by 90 degrees. The phase of clock signal ϕ p1 lags behind the phase of the clock signal ϕ p4 by 90 degrees, the phases of the clock signal ϕ p2 lags behind the phase of the clock signal ϕ p1 by 90 degrees, the phase of the clock signal ϕ p3 lags behind the phase of the clock signal ϕ p2 by 90 degrees, and the phase of the clock signal ϕ p4 lags behind the phase of the clock signal ϕ p3 by 90 degrees.

FIG. 8A through FIG. 8J are timing diagrams used for illustrating operation of the logic circuit 200 shown in FIG. 7. As shown in FIG. 8A and FIG. 8B, there are shown a clock signal ϕ 1 and a clock signal ϕ 2 whose phases are different from each other by 90 degrees and each of which has a duty cycle of 50 percent. Also, as shown in FIG. 8A through 8F, the clock signal ϕ p1 becomes H level at a timing corresponding to a rising edge of the clock signal ϕ 1. The clock signal ϕ p2 becomes H level at a timing corresponding to a rising edge of the clock signal ϕ 2. The clock signal ϕ p3 becomes H level at a timing corresponding to a falling edge of the clock signal ϕ 1. The clock signal ϕ p4 becomes H level at a timing corresponding to a falling edge of the clock signal ϕ 2.

The domino logic circuit 210 starts precharge when the clock signal φ p1 becomes H level, and autonomously finishes the precharge. Then, the domino logic circuit 210 performs an evaluation, and the result of the evaluation is outputted to the domino logic circuit 220. The domino logic circuit 220 starts precharge when the clock signal φ p2 becomes H level, and autonomously finishes the precharge. Then, the domino logic circuit 220 performs an evaluation, and the result of the evaluation is outputted to the domino logic circuit 230. The domino logic circuit 230 starts precharge when the clock signal φ p3 becomes H level, and autonomously finishes the precharge. Then, the domino logic circuit 230 performs an evaluation, and the result of the evaluation is outputted to the domino logic circuit 240. The domino logic circuit 240 starts precharge when the clock signal φ p4 becomes H level, and autonomously finishes the precharge. Then, the domino logic circuit 240 performs an evaluation, and the result of the evaluation is outputted to the domino logic circuit 210.

Assuming that a precharge time of each of the domino logic circuits 210, 220, 230 and 240 is Td, an evaluation time of each of the domino logic circuits 210, 220, 230 and 240 is Td, and a magnitude of a clock skew is Ts, when a clock skew does not exists, the logic circuit 200 can operate in a cycle time which satisfy the following relation.

$$4Td<T$$

Also, even when a clock skew exists, if an evaluation of each of the domino logic circuits 210, 220, 230 and 240 finishes before the start of a precharge of the next cycle, and a precharge of each of the domino logic circuits itself finishes before the precharge of the next domino logic circuits 220, 230, 240 and 210, that is, when:

$$Ts+Tp+Td<T, \text{ and}$$

$$Ts<T/4,$$

the logic circuit 200 can operate in a cycle time T represented as follows.

$$4Td<T$$

When the logic circuit is controlled by the four phases clock signals, the maximum value of Td is T/4. Therefore, a magnitude of the clock skew Ts which does not affect an operation of the logic circuit is represented as follows.

$$Ts<\min(3T/4=Tp,\ T/4)$$

Here min(x, y) represents a smaller value between x and y. Similarly, when a logic circuit is constituted by using the domino logic circuits according to the present invention and the logic circuit is controlled by using N-phase pulse-like clock signals, a magnitude of a clock skew Ts which does not affect an operation of the logic circuit is represented as follows.

$$Ts<\min(N-1)T/N-Tp,\ T/N)$$

As mentioned above, in the domino logic circuit and in the domino logic element according to the present invention, a timing of start of precharge phase is determined by a clock signal, but a timing of end of precharge and start evaluation is autonomously determined by the domino logic element itself. Therefore, even if clock skew and/or clock jitter exist, the domino logic element and the domino logic circuit according to the present invention are not affected by them and can operate correctly. Thus, according to the present invention, loss of an effective cycle time is not caused by the clock skew and/or clock jitter, and it becomes possible to realize a high speed logic circuit.

Also, in the logic circuit having a plurality of domino logic circuits coupled in tandem, an evaluation of a domino logic circuit in a rear stage starts at a timing earlier than a start of precharge phase of a domino logic circuit in a preceding stage, and thus a latch circuit is not required between the domino logic circuits. Therefore, it is possible to eliminate a delay time caused by the latch circuit, and it is possible to realize a high speed logic circuit.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative sense rather than a restrictive sense, and all such modifications are to be included within the scope of the present invention. Therefore, it is intended that this invention encompasses all of the variations and modifications as fall within the scope of the appended claims.

What is claimed is:

1. A dynamic logic element comprising:

a dynamic logic circuit portion producing an output signal in response to an input signal by performing a precharge operation and a discharge operation at a dynamic node; and a detecting circuit portion which stops said precharge operation at said dynamic node when a potential level of said dynamic node reaches a predetermined potential level, wherein said detecting circuit portion comprises:

a MOS transistor of a first channel type which has a source terminal coupled to a power supply terminal, a gate terminal coupled to an output terminal of said dynamic logic element, and a drain terminal coupled to a dynamic node for retaining a precharge condition; and a MOS transistor of a second channel type which has a drain terminal coupled to said dynamic node for retaining a precharge condition, a gate terminal coupled to a clock input terminal of said dynamic logic element, and a source terminal coupled to a the ground terminal, said second channel type being opposite to said first channel type; and said dynamic logic element comprises a first channel type MOS transistor for precharging, a plurality of second channel type MOS transistors constituting a MOS logic network, a second channel type MOS transistor for discharging and an inverter element;

wherein said first channel type MOS transistor for precharging has a source terminal coupled to a power terminal, a gate terminal coupled to said dynamic node for retaining a precharge condition, and a drain terminal coupled to a dynamic node for retaining an output signal;

wherein a main current path of said MOS logic network is coupled between said dynamic node for retaining an output signal and a drain terminal of said second channel type MOS transistor for discharging;

wherein a source terminal of said second channel type MOS transistor for discharging is coupled to the ground terminal, and a gate terminal of said second channel type MOS transistor is coupled to said dynamic node for retaining a precharge condition; and wherein an input of said inverter element is coupled to said dynamic node for retaining an output signal, and an output of said inverter element is coupled to said output terminal.

2. A dynamic logic element as set forth in claim 1, wherein said detecting circuit portion starts an evaluation phase immediately after an end of said precharge operation.

3. A dynamic logic element as set forth in claim 1, wherein said dynamic logic element comprises a first channel type MOS transistor for precharging, a plurality of second channel type MOS transistors constituting a MOS logic network, and an inverter element;

wherein said first channel type MOS transistor for precharging has a source terminal coupled to a power supply terminal, a gate terminal coupled to said dynamic node for retaining a precharge condition, and a drain terminal coupled to a dynamic node for retaining an output signal;

wherein a main current path of said MOS logic network is coupled between said dynamic node for retaining an output signal and the ground terminal; and wherein an input of said inverter element is coupled to said dynamic node for retaining an output signal, and an output of said inverter element is coupled to said output terminal.

4. A dynamic logic element as set forth in claim 1, wherein, in said detecting circuit portion, a current drive ability of said MOS transistor of a first channel type is larger than a current drive ability of said MOS transistor of a second channel type.

5. A dynamic logic element as set forth in claim 1, wherein said clock signal inputted to said clock signal input terminal of said dynamic logic element is a pulse-like clock signal having a duty cycle smaller than 50 percent.

6. A dynamic logic element as set forth in claim 1, wherein, upon detection of completion of a precharge operation, said detecting circuit portion isolates between a power supply terminal and a dynamic node for retaining an output signal, thereby terminating a precharge phase.

7. A dynamic logic element as set forth in claim 1, wherein, upon detection of completion of a precharge operation, said detecting circuit portion isolates between a power supply terminal and a dynamic node for retaining an output signal, thereby terminating a precharge phase and simultaneously starts an evaluation phase for determining an output value of said dynamic logic element based on input signals applied to input terminals of said dynamic logic element.

8. A dynamic logic element comprising:

a dynamic logic circuit portion producing an output signal in response to an input signal by performing a precharge operation and a discharge operation at a dynamic node; and a detecting circuit portion which stops said precharge operation at said dynamic node when a potential level of said dynamic node reaches a predetermined potential level, wherein said detecting circuit portion comprises:

a MOS transistor of a first channel type which has a source terminal coupled to a power supply terminal, a gate terminal coupled to an output terminal of said dynamic logic element, and a drain terminal coupled to a dynamic node for retaining a precharge condition; and a MOS transistor of a second channel type which has a drain terminal coupled to said dynamic node for retaining a precharge condition, a gate terminal coupled to a clock input terminal of said dynamic logic element, and a source terminal coupled to the ground terminal, said second channel type being opposite to said first channel type; and wherein, in said detecting circuit portion, a current drive ability of said MOS transistor of a first channel type is larger than a current drive ability of said MOS transistor of a second channel type.

9. A dynamic logic element as set forth in claim 8, wherein said detecting circuit portion starts and evaluation phase immediately after an end of said precharge operation.

10. A dynamic logic element as set forth in claim 8, wherein said dynamic logic element comprises a first channel type MOS transistor for precharging, a plurality of second channel type MOS transistors constituting a MOS logic network, and an inverter element;

wherein said first channel type MOS transistor for precharging has a source terminal coupled to a power supply terminal, a gate terminal coupled to said dynamic node for retaining a precharge condition, and a drain terminal coupled to a dynamic node for retaining an output signal;

wherein a main current path of said MOS logic network is coupled between said dynamic node for retaining an output signal and the ground terminal; and wherein an input of said inverter element is coupled to said dynamic node for retaining an output signal, and an output of said inverter element is coupled to said output terminal.

11. A dynamic logic element as set forth in claim 8, wherein said clock signal inputted to said clock signal input terminal of said dynamic logic element is a pulse-like clock signal having a duty cycle smaller than 50 percent.

12. A dynamic logic element as set forth in claim 8, wherein, upon detection of completion of a precharge operation, said detecting circuit portion isolates between a power supply terminal and a dynamic node for retaining an output signal, thereby terminating a precharge phase.

13. A dynamic logic element as set forth in claim 8, wherein, upon detection of completion of a precharge operation, said detecting circuit portion isolates between a power supply terminal and a dynamic node for retaining an output signal, thereby terminating a precharge phase and simultaneously starts an evaluation phase for determining an output value of said dynamic logic element based on input signals applied to input terminals of said dynamic logic element.

14. A domino logic circuit for use in a dynamic logic circuit, said domino logic circuit comprises:

a plurality of domino logic elements which are coupled in tandem and in which a common clock signal is supplied to clock input terminals of said plurality of domino logic elements;

wherein each of said domino logic elements comprises a detecting circuit portion which receives an output signal of said domino logic element fed back thereto, which detects completion of a precharge operation, and which, upon detection of completion of a precharge operation, finishes a precharge phase, wherein said detecting circuit portion in each of said domino logic elements comprises:

a MOS transistor of a first channel type which has a source terminal coupled to a power supply terminal, a gate terminal coupled to an output terminal of said domino logic element, and a drain terminal coupled to a dynamic node for retaining a precharge condition; and a MOS transistor of a second channel type which has a drain terminal coupled to said dynamic node for retaining a precharge condition, a gate terminal coupled to a clock input terminal of said domino logic element, and a source terminal coupled to the ground terminal, said second channel type being opposite to said first channel type; and, wherein, among said plurality of domino logic elements coupled in tandem, said domino logic element at the most front stage comprises:

a first channel type MOS transistor for precharging, a plurality of second channel type MOS transistors constituting a MOS logic network, a second channel type MOS transistor for discharging and an inverter element;

wherein said first channel type MOS transistor for precharging has a source terminal coupled to a power supply terminal, a gate terminal coupled to said dynamic node for retaining a precharge condition, and a drain terminal coupled to a dynamic node for retaining an output signal;

wherein a main current path of said MOS logic network is coupled between said dynamic node for retaining an output signal and a drain terminal of said second channel type MOS transistor for discharging;

wherein a source terminal of said second channel type MOS transistor for discharging is coupled to the ground terminal, and a gate terminal of said second channel type MOS transistor is coupled to said dynamic node for retaining a precharge condition;

wherein an input of said inverter element is coupled to said dynamic node for retaining an output signal, and an output of said inverter element is coupled to said output terminal;

wherein, among said plurality of domino logic elements coupled in tandem, each of said domino logic elements at the second stage and the stage thereafter comprises a first channel type MOS transistors for precharging, a plurality of second channel type MOS transistor constituting a MOS logic network, and an inverter element;

wherein said first channel type MOS transistor for precharging has a source terminal coupled to a power supply terminal, a gate terminal coupled to said dynamic node for retaining a precharge condition, and a drain terminal coupled to a dynamic node for retaining an output signal;

wherein a main current path of said MOS logic network is coupled between said dynamic node for retaining an output signal and the ground terminal; and wherein an input of said inverter element is coupled to said dynamic node for retaining an output signal, and an output of said inverter element is coupled to said output terminal.

15. A domino logic circuit as set forth in claim 14, wherein each of all of said domino logic element coupled in tandem comprises a first channel type MOS transistor for precharging, a plurality of second channel type MOS transistors constituting a MOS logic network, and an inverter element;

wherein said first channel type MOS transistor for precharging has a source terminal coupled to a power supply terminal, a gate terminal coupled to said dynamic node for retaining a precharge condition, and a drain terminal coupled to a dynamic node for retaining an output signal.

16. A domino logic circuit for use in a dynamic logic circuit, said domino logic circuit comprises:

a plurality of domino logic elements which are coupled in tandem and in which a common clock signal is supplied to clock input terminals of said plurality of domino logic elements;

wherein each of said domino logic elements comprises a detecting circuit portion which receives an output signal of said domino logic element fed back thereto, which detects completion of a precharge operation, and which, upon detection of completion of a precharge operation, finishes a precharge phase, wherein said detecting circuit portion in each of said domino logic elements comprises:

a MOS transistor of a first channel type which has a source terminal coupled to a power supply terminal, a gate terminal coupled to an output terminal of said domino logic element, and a drain terminal coupled to a dynamic node for retaining a precharge condition; and a MOS transistor of a second channel type which has a drain terminal coupled to said dynamic node for retaining a precharge condition, a gate terminal coupled to a clock input terminal of said domino logic element, and a source terminal coupled to the ground terminal, said second channel type being opposite to said first channel type; and wherein each of all of said plurality of domino logic elements coupled in tandem comprises a first channel type MOS transistor for precharging, a plurality of second channel type MOS transistors constituting a MOS logic network, a second channel type MOS transistor for discharging and an inverter element;

wherein said first channel type MOS transistor for precharging has a source terminal coupled to a power supply terminal, a gate terminal coupled to said dynamic node for retaining a precharge condition, and a drain terminal coupled to a dynamic node for retaining an output signal;

wherein a main current path of said MOS logic network is coupled between said dynamic node for retaining an output signal and a drain terminal of said second channel type MOS transistor for discharging;

wherein a source terminal of said second channel type MOS transistor for discharging is coupled to the ground terminal, and a gate terminal of said second channel type MOS transistor is coupled to said dynamic mode for retaining a precharge condition; and wherein an input of said inverter element is coupled to said dynamic node for retaining an output signal, and an output of said inverter element is coupled to said output terminal.

17. A domino logic circuit as set forth in claim 16, wherein said detecting circuit portion in each of said domino logic elements starts an evaluation phase immediately after an end of said precharge phase.

18. A domino large circuit as set forth in claim 16, wherein each of all of said domino logic elements coupled in tandem comprises a first channel type MOS transistor for precharging, a plurality of second channel type MOS transistors constituting a MOS logic network, and an inverter element;

wherein said first channel type MOS transistor for precharging has a source terminal coupled to a power supply terminal, a gate terminal coupled to said dynamic node for retaining a precharge condition, and a drain terminal coupled to a dynamic node for retaining an output signal;

wherein a main current path of said MOS logic network is coupled between said dynamic node for retaining an output signal and the ground terminal;

wherein an input of said inverter element is coupled to said dynamic node for retaining an output signal, and an output of said inverter element is coupled to said output terminal; and wherein logic signals supplied from external renders said MOS logic network open circuit condition during said precharge phase.

19. A dynamic logic circuit comprising:

N domino logic circuits coupled in tandem, where N is a positive integer;

wherein each of said domino logic circuits comprises a plurality of domino logic elements which are coupled in tandem and in which a common clock signal is supplied to clock input terminals of said plurality of domino logic elements in one domino logic circuit;

wherein the phase of a clock signal inputted to a domino logic circuit lags behind the phase of clock signal inputted to a domino logic circuit at the preceding state by 360/N degrees; and wherein each of said domino logic elements constituting each of said domino logic circuits comprises a detecting circuit portion which receives an output signal of said domino logic element fed back thereto, which detects completion of a precharge operation, and which, upon detection of completion of a precharge operation, finishes a precharge phase, wherein adjacent domino logic circuits of said N domino logic circuits are coupled in tandem without interposing a buffer circuit therebetween, and wherein, in at least one of said domino logic circuits, among said plurality of domino logic elements coupled in tandem, said domino logic element at the most front stage comprises:

a first channel type MOS transistor for precharging, a plurality of second channel type MOS transistors constituting a MOS logic network, a second channel type MOS transistor for discharging and an inverter element;

wherein said first channel type MOS transistor for precharging has a source terminal coupled to a power supply terminal, a gate terminal coupled to a dynamic node for retaining a precharge condition, and a drain terminal coupled to dynamic node for retaining an output signal;

wherein a main current path of said MOS logic network is coupled between said dynamic node for retaining an output signal and drain terminal of said second chamber type MOS transistor for discharging;

wherein a source terminal of said second channel type MOS transistor for discharging is coupled to the ground terminal, and a gate terminal of said second channel type MOS transistor is coupled to said dynamic node for retaining a precharge condition;

wherein an input of said inverter element is coupled to said dynamic node for retaining an output signal, and an output of said inverter element is coupled to said output terminal;

wherein, in said at least one of said domino logic circuits, among said plurality of domino logic elements coupled in tandem, each of said domino logic elements at the second stage and the stage thereafter comprises a first channel type MOS transistor for precharging, a plurality of second channel type MOS transistors constituting a MOS logic network, and an inverter element;

wherein said first channel type MOS transistor for precharging has a source terminal coupled to a power supply terminal, a gate terminal coupled to said dynamic node for retaining a precharge condition, and a drain terminal coupled to a dynamic node for retaining an output signal;

wherein a main current path of said MOS logic network is coupled between said dynamic node for retaining an output signal and the ground terminal; and wherein an input of said inverter element is coupled to said dynamic node for retaining an output signal, and an output of said inverter element is coupled to said output terminal.

20. A domino logic circuit as set forth in claim 14, wherein said detecting circuit portion in each of said domino logic elements starts an evaluation phase immediately after an end of said precharge phase.

* * * * *

UNITED STATES PATENT AND TRADEMARK OFFICE

CERTIFICATE OF CORRECTION

PATENT NO. : 6,320,420 B1
DATED : November 20, 2001
INVENTOR(S) : Shibayama

It is certified that error appears in the above-identified patent and that said Letters Patent is hereby corrected as shown below:

<u>Column 18,</u>
Line 44, delete "a" after -- to --
Line 53, insert -- supply -- after "power"

<u>Column 20,</u>
Line 10, "and" should be -- an --

<u>Column 21,</u>
Line 41, "transistors" should be -- transistor --
Line 42, "transistor" should be -- transistors --
Line 59, "element" should be -- elements --

<u>Column 24,</u>
Line 10, "chamber" should be -- channel --

Signed and Sealed this

First Day of October, 2002

*Attest:*

JAMES E. ROGAN

*Attesting Officer* *Director of the United States Patent and Trademark Office*